United States Patent
Siegmund et al.

(10) Patent No.: US 11,227,959 B2
(45) Date of Patent: Jan. 18, 2022

(54) METHOD FOR DETECTING AND CONVERTING INFRARED ELECTROMAGNETIC RADIATION

(71) Applicant: SENORICS GMBH, Dresden (DE)

(72) Inventors: Bernhard Siegmund, Dresden (DE); Koen Vandewal, Dresden (DE); Andreas Mischok, Dresden (DE); Johannes Benduhn, Dresden (DE); Donato Spoltore, Dresden (DE); Christian Körner, Dresden (DE); Karl Leo, Dresden (DE)

(73) Assignee: SENORICS GMBH, Dresden (DE)

( * ) Notice: Subject to any disclaimer, the term of this patent is extended or adjusted under 35 U.S.C. 154(b) by 144 days.

(21) Appl. No.: 15/740,409

(22) PCT Filed: Aug. 12, 2016

(86) PCT No.: PCT/EP2016/069256
§ 371 (c)(1),
(2) Date: Dec. 28, 2017

(87) PCT Pub. No.: WO2017/029223
PCT Pub. Date: Feb. 23, 2017

(65) Prior Publication Data
US 2018/0198005 A1    Jul. 12, 2018

(30) Foreign Application Priority Data
Aug. 14, 2015  (DE) .......................... 102015215581.1

(51) Int. Cl.
*H01L 31/0232* (2014.01)
*H01L 31/0256* (2006.01)
(Continued)

(52) U.S. Cl.
CPC ...... *H01L 31/02327* (2013.01); *H01L 27/307* (2013.01); *H01L 31/0256* (2013.01);
(Continued)

(58) Field of Classification Search
CPC ... G11B 7/0065; B42D 25/382; Y02E 10/549; H01L 51/5072; H01L 2031/0344;
(Continued)

(56) References Cited

U.S. PATENT DOCUMENTS 7,446,297 B1   11/2008  Sigel
2004/0016923 A1  1/2004  Yu et al.
(Continued)

FOREIGN PATENT DOCUMENTS

CN   101088179 A   12/2007
CN   102539379 A    7/2012

OTHER PUBLICATIONS

Lv et al., (Near Infrared Sensitive Organic Photodiode Utilizing Exciplex Absorption in NdPc2/C60 Heterojunction), IEEE Photonics Technology Letters, vol. 27, No. 19, Oct. 1, 2015.*
(Continued)

*Primary Examiner* — Niki Bakhtiari
(74) *Attorney, Agent, or Firm* — Heslin Rothenberg Farley & Mesiti P.C.

(57) ABSTRACT

A method for detecting infrared electromagnetic radiation and for converting same into an electrical signal, an optoelectronic component, in particular an organic infrared detector for (near) infrared detection, and use thereof for detecting an electromagnetic signal in the wavelength range of 780 nm to 10 μm, are provided.

21 Claims, 14 Drawing Sheets

(51) Int. Cl.
H01L 51/44 (2006.01)
H01L 51/42 (2006.01)
H01L 27/30 (2006.01)
H01L 31/054 (2014.01)
H01L 31/18 (2006.01)
B82Y 20/00 (2011.01)

(52) U.S. Cl.
CPC .......... H01L 31/0547 (2014.12); H01L 31/18 (2013.01); H01L 51/447 (2013.01); *B82Y 20/00* (2013.01); *H01L 51/4253* (2013.01); *H01L 2031/0344* (2013.01); *Y02E 10/52* (2013.01); *Y02E 10/549* (2013.01)

(58) Field of Classification Search
CPC .......... H01L 31/0256; H01L 31/02327; H01L 51/4253; H01L 51/428; H01L 51/44
See application file for complete search history.

(56) References Cited

U.S. PATENT DOCUMENTS

2006/0027801 A1    2/2006   Forrest et al.
2009/0289247 A1   11/2009   Meng et al.
2010/0006154 A1*   1/2010   Kitazawa ............... B82Y 10/00
                                                                         136/263

OTHER PUBLICATIONS

International Search Report for PCT/EP2016/069256, dated Oct. 14, 2016.
Bednorz et al., "Silicon/organic hybrid heterojunction Infrared photodetector operating in the telecom regime," Organic Electronics, Mar. 14, 2013, vol. 14, pp. 1344-1350, Elsevier.
Baeg et al., "Organic light detectors: photodiodes and phototransistors," Advances Materials, Mar. 11, 2013, pp. 4267-4295, Wiley-VCH.
Beenken, et al., "Sub-bandgap absorption in organic solar cells: experiment and theory," PCCP Jul. 11, 2013, vol. 15, pp. 16494-16502, RSC Publishing.
Gong et al., "Understanding charge transfer in carbon nanotube-fullerene bulk heterojunctions," Applied Materials & Interfaces, Mar. 23, 2015, vol. 7, pp. 7428-7435, ACS Publications.
Lih, et al., "Near-infrared laser-driven polymer photovoltaic devices and their biomedical applications," Energy & Environmental Science, Jun. 20, 2011, vol. 4, pp. 3374-3378, RSC Publishing.
James N. Humphrey, "Optimum utilization of lead sulfite infrared detectors under diverse operating conditions," Applied Optics, Jun. 1965, vol. 4, No. 6, pp. 665-675, OSA Publishing.
Zhou et al., "Low band gap polymers for photovoltaic device with photocurrent response wavelengths over 1000 nm," Polymer, Oct. 5, 2013, vol. 54, pp. 6501-6509, Elsevier.
Jailaubekov, et al., "Hot charge-transfer excitons set the time limit for charge separation at donor/acceptor interfaces in organic photovoltaics," Nature Materials, Dec. 9, 2012, vol. 12, pp. 66-73, Nature.com.
Furchi et al., "Microcavity-Integrated Graphene Photodetector," Nano Letters, May 7, 2012, vol. 12, pp. 2773-2777, ACS Publications.

Liu et al., "Large-area, Transparent, and Flexible Infrared Photodetector Fabricated Using P-N Junctions Formed by N-Doping Chemical Vapor Deposition Grown Graphene," Nano Letters, Jun. 13, 2014, vol. 14, pp. 3702-3708, ACS Publications.
Downs et al., "Progress in Infrared Photodetectors Since 2000," Sensors, Apr. 16, 2013, vol. 13, pp. 5054-5098, MDPI.
Miller et al., "Factors Governing Intercalation of Fullerenes and Other Small Molecules Between the Side Chains of Semiconducting Polymers Used in Solar Cells," Advanced Energy Materials, Aug. 22, 2012, vol. 2, pp. 1208-1217, Wiley-VCH.
Competition between Charge-Transfer Exciton Dissociation and Direct Photocarrier Generation in Molecular Donor-Acceptor Compounds, Physical Review Letters, 2010, vol. 105, pp. 226601-1-226601-4, Jun'ya Tsutsumi et al.
Bakulin et al., The Role of Driving Energy and Delocalized States for Charge Separation in Organic Semiconductors, Mar. 16, 2012, pp. 1340-1344, vol. 335, American Association for the Advancement of Science, Washington, DC, United States.
Clarke et al., Charge Photogeneration in Organic Solar Cells, 2010, pp. 6736-6767, vol. 110, No. 11, Centre for Plastic Electronic, Department of Chemistry, Imperial College London, London, United Kingdom.
Dimitrov et al., On the Energetic Dependence of Charge Separation in Low Bandgap Polymer/Fullerene Blends, pp. 1-5, Journal of the American Chemistry Society, Centre for Plastic Electronic, Department of Chemistry, Imperial College London, London, United Kingdom.
Huang et al., Electronic structures of interfacial states formed at polymeric semiconductor heterojunctions, Jun. 2008, pp. 483-489, vol. 7, Nature Publishing Group.
Jailaubekov et al., Hot charge-transfer excitons set the time limit for charge separation at donor/acceptor interfaces in organic photovoltaics, Dec. 9, 2012, pp. 66-73, vol. 12, Jan. 2013, Nature Materials, Articles.
Janssen et al., Factors Limiting Device Efficiency in Organic Photovoltaics, 2013, 25, pp. 1847-1858, Advanced Materials, 2013 Wiley-VCH Verlag GmbH & Co. KGaA, Weinheim.
Liu et al., Solution-processed small-molecule solar cells: breaking the 10% power conversion efficiency, Nov. 28, 2013, pp. 1-8, Scientific Reports, 3, 3356, DOI:10.1038/srep03356.
Mishra et al., Small Molecule Organic Semiconductors on the Move: Promises for Future Solar Energy Technology, 2012, 51, pp. 2020-2067 2012 Wiley-VCH Verlag GmbH & Co. KGaA, Weinheim.
Muntwiler et al., Coulomb Barrier for Charge Separation at an Organic Semiconductor Interface, PRL 101, 196403 (2008).
Ohkita et al., Charge Carrier Formation in POlythiophene/Fullerene Blend Films Studied by Transient Absorption Spectroscopy, Feb. 16, 2008, pp. 3030-3042, vol. 130, No. 10, American Chemistry Society.
Peumans et al., Separation of geminate charge-pairs at donor-acceptor interfaces in disordered solids, Aug. 26, 2004, pp. 27-31, Chemical Physics Letters 398, Elsevier B.V.
Scharber et al., Design Rules for Donors in Bulk-Heterojunction Solar Cells - Towards 10% Energy-Conversion Efficiency, 2006, 18, pp. 789-794, Advanced Materials, 2006 Wiley-VCH Verlag GmbH & Co. KGaA, Weinheim.
Servaites et al., Modeling geminate pair dissociation in organic solar cells: high power conversion efficiencies achieved with moderate optical bandgaps, Feb. 14, 2012, vol. 5, No. 8, pp. 8343-8350, The Royal Society of Chemistry.

* cited by examiner

| Layer number | Materials | Layer thickness or variation/nm | Function |
|---|---|---|---|
| 17 | Glass | 10^6 | Encapsulation |
| 16 | Nitrogen | 10^5 | Spacer medium for suppressing interference between layer numbers 17 and 15 |
| 15 | P4-Ph4-DIP | Z={0,200} | Component 2 of the optical filter layer |
| 14 | ZnPc | Z={0,200} | Component 1 of the optical filter layer |
| 13 | Alq3 | 50 | Component 2 of the barrier layer |
| 12 | MoO3 | 10 | Component 1 of the barrier layer |
| 11 | Ag | 75 | Mechanical reinforcement of the substrate-remote electrode for reducing the electrical resistance (outside the active area) |
| 10 | Ag | Y={0,18,27,36,45,54} | Partially transparent mirror layer and substrate-remote electrode |
| 9 | Au | 1 | Germ layer for smooth growth of the silver layer 10 |
| 8 | MoO3 | 3 | Diffusion barrier for silver atoms of layer 10 |
| 7 | BF-DPB : NDP9 (10Ma%) | X2={31,63,70,74,79,83} | Substrate-remote optical spacer layer and transport layer for holes |
| 6 | ZnPc | 5 | Charge carrier blocking layer for electrons |
| 5 | ZnPc : C60 (1:1) | 50 | Photoactive layer |
| 4 | C60 | 5 | Charge carrier blocking layer for holes |
| 3 | Bis-HFl-NTCDI : W2(hpp)4 (7Ma%) | X1={36,65,71,76,81,86} | Substrate-near optical spacer layer and transport layer for electrons |
| 2 | Ag | 100 | Opaque mirror layer and substrate-near electrode |
| 1 | Glass | 10^6 | Substrate |

Fig. 5

METHOD FOR DETECTING AND CONVERTING INFRARED ELECTROMAGNETIC RADIATION

CROSS REFERENCE TO RELATED APPLICATIONS

This application is the National Phase filing under 35 U.S.C. § 371 of International Application No. PCT/EP2016/069256, filed on Aug. 12, 2016, and published on Feb. 23, 2017, as WO 2017/029223 A1, and claims priority to German Application No. 102015215581.1, filed on Aug. 14, 2015. The contents of each of the prior applications are hereby incorporated by reference herein in their entirety.

FIELD OF THE INVENTION

The present invention relates to a method for detecting infrared electromagnetic radiation and for converting same into an electrical signal, an optoelectronic component, in particular an organic infrared detector for (near) infrared detection, and use thereof for detecting an electromagnetic signal in the wavelength range of 780 nm to 10 µm.

BACKGROUND ART

Photosensitive, optoelectronic components convert electromagnetic ambient radiation into electricity. The component class comprises solar cells and detectors. Solar cells are optimized in order to convert the greatest possible proportion of sunlight into electrical power. By contrast, detectors are often operated with an externally applied voltage (and accordingly are not energy self-sufficient) in order to attain higher external quantum efficiencies in the detection range and quicker response times. Furthermore, their detection range can lie beyond visible light. They are often connected to a device for reading out and further processing the current strength generated by the optoelectronic component.

A wide range of solution approaches for infrared detectors (IR detectors) are known from the prior art, and these are divided into five categories in accordance with their operating principle. Here, a person skilled in the art distinguishes between the following:

1. Detectors are known which are based on the singlet absorption of a semiconductor, in which electrons are lifted from a fully occupied state (valence band energy or HOMO energy or lower energy) to an unoccupied level (conduction band energy or LUMO energy or higher energy). Based on the active medium used, a further subdivision can be made into the following four groups:
a) The inorganic-based IR detectors are mostly based on the use of rare earths, for example indium or gallium, wherein the production thereof is technically demanding and therefore energy-intensive and in particular cost-intensive, which is disadvantageous. At the same time, inorganic-based IR detectors are mechanically inflexible and lead to more voluminous or heavier components compared to organic-based solution approaches (Downs and Vandervelde, Sensors 2013, 13, doi:10.3390/s130405054).
b) In a further inorganic-based embodiment, lead-containing salts such as lead (II) sulphide are used, but have much slower response times than in 1a) and are classified as being particularly toxic on account of the lead content (Humphrey, Appl. Opt. 1965 4, 665-675).
c) In organic-based IR detectors produced by the vacuum processing of organic compounds, it is in particular disadvantageous that only some of these IR detectors have an absorption at wavelengths higher than 1000 nm (Baeg et al., *Advanced Materials* 2013, 25(31), 4267-4295). This is based on the high thermostable requirements for sublimation, which is conflicting with organic semiconductors with lower-energy band gap (i.e. absorption in the near infrared wavelength range).
d) Organic-based IR detectors can alternatively also be produced by means of solvent processing, wherein only a few compositions for photoactive layers with singlet absorption above 1000 nm, such as the combination of zinc porphyrin dimer with phenyl-C61-butyric acid methyl ester (PCBM for short) and 4,4'-bipyridil (Bipy for short) additive, are described in the literature. Nevertheless, it is disadvantageous that the maximum external quantum efficiency of these IR detectors under short-circuit conditions is limited to 13.5% (at 1400 nm).
e) Carbon-based IR detectors in which in particular carbon nanotubes or graphene monolayers are used have much lower maximum external quantum efficiencies of 2.3% or 2% under short-circuit conditions and at the same time allow absorption merely over a wide frequency band of from 400 nm to 1600 nm, so that the optoelectronic component is not selectively sensitive for IR radiation (Gong et al., *ACS Applied Materials & Interfaces* 2015, 150330161533004. doi:10.1021/acsami.5b01536 and Furchi et al., *Nano Letters* 2012, 12(6), 2773-2777).
2. IR detectors which are based on the absorption of the direct interchromophoric charge transfer state are also known and are subdivided in accordance with the active medium used:
a) Bednorz et al. (Organic Electronics: Physics, Materials, Applications 2013, 14(5), 1344-1350) disclose that, in the case of hybrid IR detectors, which utilize the absorption of the direct interchromophoric charge transfer state at the transition of an organic layer (for example perylene derivatives) to an inorganic layer (for example silicon). The authors report a low external quantum efficiency (EQE) of much less than 1% at a wavelength of 1550 nm. What is furthermore disadvantageous is that IR detectors of this kind are mechanically inflexible and their production requires rare earths, such as indium or gallium, which significantly increases the production cost.
b) The absorption of the direct interchromophoric charge transfer state between an organic semiconductor and fullerenes, in particular from the mixed layer poly(3-hexylthiophene) (P3HT for short) with phenyl-C61-butyric acid methyl ester (PCBM for short), is known from the publication by Wu et al. (Energy & Environmental Science 2011, 4(9), 3374. doi:10.1039/c1ee01723c). On account of the very weak absorption coefficient, the photoactive layer of 125 nm leads merely to an EQE of 0.05% with electromagnetic irradiation at a wavelength of 980 nm. Beenken et al. (Phys. Chem. Chem. Phys. 2013, 15, 16494. doi: 10.1039/c3cp42236d) also deduce a low oscillator strength of the direct interchromophoric charge transfer (intermolecular charge-transfer transition) from the consideration of absorption spectra of the same mixed layer (P3HT:PCBM). The resultant charge transfer excitons are assumed to be thermally stable, which implies no, or only an extremely low photocurrent generation by means of the considered charge transfer state.

Document US 2009/0289247 A1 discloses more efficient IR detectors, which propose photoactive layers thicker than 10 μm, in order to increase the absorption of the direct interchromophoric charge transfer state. For effective operation of IR detectors of this kind, however, high operating voltages of 100 V or more are necessary in order to overcome the high electrical resistance of the photoactive layer, the layer thickness of which here is two or three orders of magnitude above the thicknesses that are conventional in solar cells. This is accompanied disadvantageously by greater dark currents and a very low on-off ratio of the photocurrent to the dark current of less than five. The ineffective charge carrier transport is also accompanied by slow response times of the photocurrent to changes over time of the radiation to be detected.

In the specialist literature, for example by Jailaubekov et al. (Nature Materials 2013, 12, 66), it was previously believed that the charge transfer state acted as a trap for photoinduced charge carriers and therefore did not contribute to photocurrent.

3. Liu et al. (*Nano Letters* 2014, 14(7), 3702-3708), as a further possibility for detecting IR radiation, describe the modulation of conductivity by light absorption. A particular disadvantage here is the low on-off ratio of the electrical conductivity of just 5%.

4. A person skilled in the art is also aware of IR detectors which are based on absorption by surface plasmons. Since these detectors are based on inorganic-based absorber materials, IR detectors of this kind have the above-mentioned disadvantages, which are associated with the use of inorganic materials. In addition, the maximum detectable wavelength is limited by the height of the Schottky barrier.

5. Lastly, quantized transitions, such as intersubband absorption in quantum well structures or transitions into quantum dots, are also known, which disadvantageously are likewise based on inorganic-based absorber materials. These detectors are also mostly based on the use of rare earths, such as indium or gallium, wherein their production is technically demanding and therefore energy-intensive and in particular cost-intensive, which is disadvantageous. In addition, inorganic-based IR detectors are mechanically inflexible and lead to more voluminous or heavier components compared to organic-based solution approaches.

A device which can also be used as an IR sensor is known from US 2004/0016923 A1. The disclosed matrix arrangements can have an organic multi-layer structure, which is disposed within a micro cavity, consisting of two electrodes. Photoinduced charge transfer is specified as a mechanism for generating a photocurrent. In accordance with the definition of the IUPAC Gold Book (doi: 10.1351/goldbook), photoinduced electron transfer is an electron transfer resulting from an electronic state created on account of the resonant interaction of electromagnetic radiation with matter. This is a multi-part process, which, prior to the actual charge transfer, firstly presupposes the formation of an excited state, for example of a donor exciton. For the individual thin layers, materials with high extinction (for example MEH-PPV or sexithiophene) are cited, which are not suitable for spectroscopy, which is sensitive, in a sufficiently broad wavelength range.

The use of transport layers in photosensitive organic components for the effective removal of separated charge carriers as photocurrent from the component is known for example from Zhou et al. (Polymer 2013, 54, 6501). With the components disclosed here there is no optimisation of the layer thickness in respect of a resonance wavelength in the absorption range of the charge transfer state.

The object of the present invention is therefore to specify a method for detecting electromagnetic radiation which overcomes the aforementioned disadvantages from the prior art and consequently provides economical, lightweight, mechanically flexible infrared detectors with high external quantum efficiency, which are characterized by a high degree of freedom with regard to the choice of the detection wavelength, in particular for use in a spectral wavelength range of from 780 nm to 10 μm.

BRIEF SUMMARY OF THE INVENTION

The method according to the invention for detecting an electromagnetic signal in the wavelength range of 780 nm to 10 μm has the steps of:
a) providing an optoelectronic component that is arranged on a substrate, and has
  i. two mirror surfaces which are spaced apart from and opposing one another and which form an optical micro cavity,
  ii. a photoactive layer arranged between the mirror surfaces and comprising at least one compound 1 and one compound 2,
  wherein the energy difference between the HOMO energy of the compound 1 and the LUMO energy of the compound 2 lies below 1.6 eV,
  wherein the optical path length between the mirror surfaces corresponds in the range of 25% to 75% to the wavelength of the electromagnetic signal to be detected, and
  wherein the energy equivalent of the wavelength range of the electromagnetic signal to be detected lies in range of
  the energy difference defined by the HOMO energy of the compound 1 and the LUMO energy of the compound 2, and
  the energy difference defined by the HOMO energy and the LUMO energy of the compound 1,
  wherein the photoactive layer is aligned, within the optical micro cavity in the spatial intensity maximum of the wavelength of the electromagnetic signal to be detected, between the mirror surfaces;
b) irradiating the optoelectronic component with an electromagnetic signal in the wavelength range of 780 nm to 10 μm;
c) amplifying the electromagnetic signal to be detected within the optical micro cavity, wherein, induced by the wavelength of the signal to be detected, a direct interchromophoric charge transfer from the compound 1 to the compound 2 takes place;
d) converting the electromagnetic signal into an electrical signal.

The global maximum of the external quantum efficiency (EQE for short) of the optoelectronic component according to the invention lies in the range of the absorption of the direct interchromophoric charge transfer state and, compared to the highest EQE from the wave range of singlet absorption, is at least at the same level, in particular higher at least by a factor of two, very particularly higher by a factor of five.

The present invention is based on the surprising finding that the weak absorption of the state at the interface of compound 1 and compound 2, or what is known as the direct interchromophoric charge transfer, can be efficiently amplified by means of the arrangement of the mirror surfaces selected in accordance with the invention.

In contrast to conventional organic solar cells, diffusion of excitons generated by singlet absorption to the donor-acceptor interface is omitted in the sense of the invention, and instead the transfer at the interface between donor and acceptor is directly excited by absorption. In accordance with the invention an optoelectronic component is thus provided for detecting electromagnetic radiation, in particular in the near and middle infrared range, which optoelectronic component selectively converts an electromagnetic signal from the totality of incident electromagnetic radiation into an electrical signal. The method according to the invention based on the direct interchromophoric charge transfer is in particular unexpected for a person skilled in the art, since in the specialist scientific literature it was previously believed that the charge transfer state acted as a trap for photoinduced charge carriers and therefore did not contribute to photocurrent.

Singlet absorption describes the sole absorption mechanism in a pure organic semiconductor layer, i.e. a semiconductor layer constructed only from an organic compound. Singlet absorption is the absorption of a photon that leads to the lifting of an electron from the HOMO energy level (or below) to the LUMO energy level (or above). In so doing, the electron leaves behind a defect (what is known as a hole) in the HOMO, which defect is electrostatically bonded to the excited electron by Coulomb interaction. The bonded two-particle state is summarized as an exciton. On account of the exciton binding energy, excitation energies 100 meV lower than the energy distance between LUMO and HOMO energy can also lead to singlet absorption.

Furthermore, a person skilled in the art distinguishes in principle between intermolecular and intramolecular charge transfers or the resultant excited charge transfer states (CT states for short).

A charge transfer is a complete or practically complete transfer of charge from a donor compound to an acceptor compound. If both compounds are anchored in the same molecule, this is an intramolecular charge transfer. If different (discrete) molecules or ions, which can also be loosely coupled by coordinated interaction, act as donor compound and acceptor compound, reference is made to an intermolecular charge transfer. In accordance with the definition of the IUPAC Gold Book (doi:10.1351/goldbook), a charge transfer is an electronic transfer in which a large part of an electrical charge is transferred from one region of a molecular unit, referred to as an electron donor, to another, referred to as an electron acceptor (intramolecular charge transfer), or from one molecular unit to another (intermolecular charge transfer). The charge transfer is typical for donor-acceptor complexes or multichromophoric molecular units.

An intermolecular charge transfer state is a weakly bonded state between an excited electron in the LUMO (or a state at a higher energy level) and a hole in the HOMO (or lower energy level), wherein the aforesaid hole and electron are disposed on physically separate molecules. The charge transfer state preferably forms at the interface between compound 1 and compound 2.

The intramolecular charge transfer state is based on an electron-donor structural unit and an electron-acceptor structural unit within an individual molecule.

With reference to FIG. 1 (left-hand illustration), two organic compounds consequently absorb only photons with the energies E1 and E2, which correspond to, or exceed the energy of their band gap (energy difference between the HOMO energy and the LUMO energy of the respective compounds). In a second step the compound excited as a result of the absorption of electromagnetic radiation can now either transition into the basic state by recombination, or can transfer the negative charge from the LUMO via an interchromophoric charge transfer to the HOMO of a second compound serving as an acceptor.

By contrast, in the sense of the present invention, a "direct interchromophoric charge transfer" is present when the absorption of a photon with the energy E3 at the interface of the compound 1 and the compound 2 involves a direct transfer of an electron from the HOMO (or lower energy level) of the compound 1 to the LUMO (or higher energy level) of the compound 2, and as a result of this a common charge transfer state is directly excited between the compound 1 and the compound 2 (cf. FIG. 1, right-hand illustration). Consequently, the energy E3 required for the direct interchromophoric charge transfer, in particular in the case of solar cell materials, is smaller than that of the respective band gaps E1 and E2.

In accordance with the invention the energy equivalent of the wavelength range of the electromagnetic signal to be detected lies in the range of (i) the energy difference defined by the HOMO energy of compound 1 and the LUMO energy of compound 2 and (ii) the energy difference defined by the HOMO energy and the LUMO energy of the compound 1 (i.e. in the absorption range of the direct interchromophoric charge transfer state between compound 1 and 2).

Here, the energy equivalent of a wavelength is defined as the photon energy E of electromagnetic radiation, which in accordance with the following equation is assigned to a wavelength $\lambda$: $E=h*c/\lambda$, wherein h corresponds to Planck's quantum of action and c corresponds to light speed.

The term HOMO, according to definition, refers to the highest occupied molecular orbital. The term LUMO, according to definition, refers to the lowest unoccupied molecular orbital.

The two functionally opposed mirror surfaces with a precisely defined distance in the micrometre range form an "optical micro cavity".

Within the sense of the invention, planar interfaces which utilize plasmonic or dielectric reflection are in particular suitable as mirror surfaces. Interfaces that are height-structured by means of a one-dimensional interference grid (in the sense of distributed feedback (DFB for short)) and which utilize total reflection are further advantageously suitable.

In accordance with the invention the distance between the mirror surfaces is to be selected so that the resonance wavelength forming within the mirror arrangement falls within the range of absorption of the direct charge transfer state. By advantageous positioning of the photoactive layer within the mirror arrangement, the absorption of the direct interchromophoric charge transfer state compared to the absorption in layer sequences without mirror surfaces is increased by a factor ranging from 10 to 10,000.

The intensity of the incident electromagnetic signal to be detected, averaged over the photoactive layer, is preferably increased by the method according to the invention by a factor of 10 to 10,000.

In order to attain a resonance wavelength of the optical micro cavity in the range of the absorption of the direct interchromophoric charge transfer state, the optical path length between the mirror surfaces, comprising all layers enclosed by the micro cavity, preferably corresponds to half the wavelength of the desired direct interchromophoric charge transfer absorption. Here, the optical path length of the micro cavity is the product of the geometrical path length and the refractive index of the medium added over all individual layers disposed between the mirror surfaces. Furthermore, the value for the desired optical path length, for example on account of plasmonic effects, has a tolerance in the region of ±50%. In the special case of a structured mirror surface (in the sense of an interference grid in accordance with a mirror surface with distributed feedback (or DFB for short)), the resonance condition must be adapted in accordance with a two- or three-dimensional regularity known to a person skilled in the art.

If electromagnetic radiation of the resonance wavelength (electromagnetic radiation with longest wavelength, which satisfies the constructive interference condition in an optical micro cavity) reaches the cavity, the incident electromagnetic signal is advantageously reflected multiple times between the two mirror surfaces, so that the optical field of this resonance wavelength is advantageously amplified. At the same time, light which does not correspond to the resonance wavelength is reflected already before it enters the optical micro cavity.

In the sense of the present invention the term "resonance wavelength" is understood to mean the wavelength of the electromagnetic signal to be detected, which corresponds in the range of 25% to 75% to the optical path length between the mirror surfaces and has the highest field amplification.

According to definition, the mirror surfaces are the two interfaces which are responsible for the forming of the optical micro cavity, i.e. the delimiting interfaces of two adjacent media of different refractive index.

The medium contacting the mirror surface and facing away from the optical micro cavity is referred to hereinafter in accordance with the invention as a mirror medium. If it is also a solid body (for example an organo-based or oxidic mirror medium), the term "mirror layer" is used hereinafter in accordance with the invention.

The resonance wavelength, based on the geometrical distance between the mirror surfaces and, as applicable, the infiltration of the optical field into the mirror layer, is disposed in the region between 10 nm and 10 µm in accordance with the constructive interference condition.

Constructive interference (i.e. amplification of the electromagnetic signal to be detected by reflection within the optical micro cavity) is produced by advantageous overlaying of the optical field at a defined wavelength. A precondition for constructive interference is the adjoining of two adjacent media, wherein the media have different refractive indices, so that a mirror surface is formed between these media. In the one-dimensional case, the constructive interference condition occurs if the optical path length between the mirror surfaces corresponds in the range of 25% to 75% to the wavelength of the signal to be detected, very particularly preferably corresponds to half the wavelength of the signal to be detected. However, plasmonic effects for example lead to deviations of the aforementioned provision in the region of ±50%.

The field amplification is defined in the sense of the invention as a spectrally dependent ratio of the optical field with utilisation of a constructive interference to the optical field without.

In accordance with a preferred embodiment of the present invention the two opposing mirror surfaces are arranged plane-parallel to one another.

The two opposing mirror surfaces preferably have a defined geometric distance in the range of 100 to 5000 nm, particularly preferably 200 to 1000 nm from one another.

Alternatively, the two opposing mirror surfaces are preferably arranged tilted with a variance of the geometric distance in the range of 1 to 500 nm, preferably 10 to 100 nm, wherein the average geometric distance between the two mirror surfaces lies in the range of from 100 to 5000 nm, particularly preferably 200 to 1000 nm from one another. The variance of the distance between the mirror surfaces particularly advantageously allows a spectroscopic examination of the incident electromagnetic radiation, wherein the electrodes are formed in a number of pieces (i.e. as an array) and are each connected to a separate read-out unit.

Each medium is preferably formed in the sense of the invention as an individual layer or layer sequence.

The mirror surface is preferably planar when the mirror medium utilizes metallic reflection by means of plasmons or dielectric reflection in conjunction with constructive interference (for example dielectric mirror layer (distributed Bragg reflector (DBR)).

In conjunction with metallic reflection by means of plasmons, especially in respect of the use in the infrared wavelength range, the following are particularly suitable as a mirror layer: silver (Ag, in particular suitable from a wavelength of the irradiation of 350 nm), gold (Au, in particular suitable from 700 nm), and aluminium (Al, in particular suitable from 1500 nm).

In conjunction with dielectric reflection and constructive interference, i.e. the DBR mirror layer, the mirror medium is formed as a layer sequence with alternately high and low refractive index. Potential materials with a low refractive index are in particular silicon dioxide ($SiO_2$, suitable in the wavelength range 250 nm to 5000 nm) or metal fluorides, in particular alkali metal, alkaline earth or rare earth metal fluorides, for example lithium fluoride (LiF) or lanthanum fluoride ($LaF_3$). Potential materials with a high refractive index are in particular inexpensive metal oxides, selected from titanium dioxide ($TiO_2$, suitable in the wavelength range 450 nm to 2500 nm), aluminium oxide ($Al_2O_3$, suitable up to 1600 nm), zirconium (IV) oxide ($ZrO_2$, suitable from 400 nm)) and sulphides such as zinc sulphide (ZnS, suitable from 800 nm). Furthermore, the metal oxides tantalum (V) oxide ($Ta_2O_5$, suitable in the wavelength range 300 nm to 1750 nm), hafnium dioxide ($HfO_2$, suitable in the wavelength range from 350 nm to 800 nm) and nitrides, such as aluminium nitride (AlN, suitable in the wavelength range between 500 nm and 5000 nm), and II-VI compound semiconductors such as zinc selenide (ZnSe for short) are suitable. The individual layers of the DBR structure here have optical layer thicknesses which correspond to a quarter of the resonance wavelength of the optical micro cavity.

In accordance with an alternative embodiment of the invention a mirror surface is provided by means of a DFB mirror layer based on total reflection, that is to say by means of a lateral height structuring (for example by means of a photoresist layer), wherein a lateral periodicity between 100 nm and 10 µm with a grid amplitude between 1 nm and 100 nm is preferably selected. In this embodiment the substrate-remote (i.e. more distant from the substrate) mirror surface corresponds to the uppermost interface of the optoelectronic component. Here, the refractive index of the mirror medium lies below all layers disposed within the optical micro cavity.

In particular, a substrate structured with a photoresist layer (for example ma-P1210 from micro resist technology GmbH) and for example made of glass or plastic is suitable as a substrate-near (i.e. arranged closest to the substrate)

mirror medium. In particular a barrier layer such as aluminium oxide (Al2O3) or inert gas such as nitrogen is suitable as substrate-remote mirror medium.

A narrow-band amplification (i.e. amplification for a wavelength interval by the resonance wavelength) of the absorbed electromagnetic radiation is advantageously provided by the optical micro cavity of the optoelectronic component. This amplification is characterized by a peak width at half-height of the external quantum efficiency (EQE) or the spectral response of less than 50 nm, particularly preferably of less than 10 nm. Due to the simultaneous tunability (i.e. selective variation) of the resonance wavelength, for example by means of layer thickness variation of the optical spacer layers, spectroscopic applications or multiplexing (i.e. simultaneous data acquisition/processing of a number of wavelengths) are particularly advantageously possible by means of the method according to the invention.

At the same time, the method according to the invention is characterized in that, compared to the conventional singlet excitation of a compound via the band gap thereof, only very low energies, preferably in the wavelength range of from 780 nm to 1 µm, are necessary for the excitation of the common direct interchromophoric charge transfer state, whereby organic compounds with, for their part, large band gaps advantageously can be used. Since no compounds that are absorbing in the visible range (i.e. with large band gap) are necessary for the method according to the invention, the individual compounds of the optoelectronic component used in accordance with the invention in order to detect an infrared signal can advantageously be insensitive (i.e. no excitation and no electrical signal) in relation to the visible wavelength range.

The compounds 1 and 2 are preferably insensitive to electromagnetic radiation from the visible wavelength range.

The optoelectronic component used in accordance with the invention (for example the detector) for electromagnetic radiation in the visible wavelength range is preferably partially or fully transparent. At the same time, the functional service life of the photoactive layer is thus advantageously extended.

The optoelectronic component used in accordance with the invention is preferably characterized by low currents of the dark characteristic curve in the order of magnitude of 10 nA/cm2.

The optoelectronic component used in accordance with the invention further preferably has an EQE preferably between 10% and 80% under short-circuit conditions for wavelengths from 780 nm to 1000 nm or an EQE greater than 0.5% for higher wavelengths in the infrared range.

A spectral response preferably in the order of magnitude of 0.01 to 0.1 A/W under short-circuit conditions in the wavelength range 780 nm to 1000 nm or for higher wavelengths in the infrared range 0.001 to 0.1 A/W is given for the optoelectronic component used in accordance with the invention, derived from the aforementioned EQE.

The optoelectronic component used in accordance with the invention preferably has a specific detectivity in the wavelength range 780 nm to 1000 nm in the order of magnitude of 1011 to 1012 Jones under short-circuit conditions, or for higher wavelengths in the infrared range has a specific detectivity at least in the order of magnitude of 109 Jones.

What is also characteristic for the optoelectronic component used in accordance with the invention is an on-off ratio of the photocurrent to the dark current in the wavelength range 780 nm to 1000 nm in the order of magnitude of 104 to 105 under short-circuit conditions with a corresponding irradiation by means of near infrared in the order of magnitude of 1 mW/cm2.

It is known to a person skilled in the art that in principle electromagnetic radiation in the range from ultraviolet to infrared can be detected using the method according to the invention. The method according to the invention is particularly advantageously suitable for detecting electromagnetic radiation in the wavelength range (spectral range) from 780 nm to 10 µm. The method according to the invention is particularly preferably suitable for detecting electromagnetic radiation in the near and/or middle infrared range from 780 to 50,000 nm, very particularly preferably in the near infrared range (NIR range) from 780 to 3000 nm according to DIN 5031.

Within the sense of the invention, the electromagnetic signal to be detected constitutes a spectral portion of all incident electromagnetic radiation. In particular, the detector reacts sensitively to a narrow interval around the resonance wavelength to be detected. Here, the external quantum efficiency of the detector according to the invention has a peak width at half-height of less than 50 nm, preferably of less than 10 nm.

The two compounds 1 and 2 in the photoactive layer are particularly preferably selected from the group of low-molecular (preferably vacuum-processable) organic compounds or from the group of polymers (preferably processable from solution) or fullerenes.

In the sense of the present invention the photoactive layer is formed as a three-dimensional layer within the optical micro cavity, in which the detection wavelength of electromagnetic radiation lies in the absorption range of the direct interchromophoric charge transfer state and of which the energy is then transferred into weakly bonded or free charge carriers.

If the photoactive layer is applied by means of vacuum processing, the compound 1 (electron donor) is preferably selected from the material group of phthalocyanines (such as zinc phthalocyanine or iron phthalocyanine), pyrans, for example bispyranilidene (also TPDP for short), the fulvalenes, for example tetrathiofulvalene (also OMTTF for short) and the aromatic amines (for example N,N,N',N'-tetrakis(4-methoxyphenyl)-benzidines (also MeO-TPD for short), 2,7-bis[N,N-bis(4-methoxy-phenyl)amino]9,9-spirobifluorenes (also Spiro-MeO-TPD for short) or 4,4',4"-tris (3-methylphenyl-phenylamino)triphenylamines (also m-MTDATA for short)), bisthiopyranilidenes, bipyridinylidenes or diketopyrrolopyrroles.

If the photoactive layer is applied by means of liquid processing, the compound 1 is preferably selected from the material group of polythiophenes (for example poly(2,5-bis (3-alkylthiophene-2-yl)thieno[3,2-b]thiophene (also pBTTT for short)).

In the case of a polymer, compound 1 is preferably characterized in such a way that the spatial distance of the side chains corresponds to the spatial extent of compound 2 (electron acceptor), so that bicrystals (as described in N. C. Miller et al., Adv. Energy Mater. 2012, 2, 1208, DOI: 10.1002/aenm.201200392) form due to the systematic incorporation of compound 2 in the gaps of the side chains of compound 1. The resultant enlarged donor-acceptor surface here leads advantageously to increased absorption of the interchromophoric charge transfer state.

Compound 2 (electron acceptor), within the scope of the application of the photoactive layer by means of vacuum processing, is preferably selected from the material group of fullerenes, for example C60.

If the photoactive layer is applied by means of liquid processing, the compound 2 is preferably phenyl-C61-butyric acid methyl ester (PCBM for short) or poly(2,5-bis(3-tetradecylthiophen-2-yl)thieno[3,2-b]thiophene) (PBTTT-C14 for short).

In accordance with a preferred embodiment of the present invention the compound 1 and the compound 2 can be covalently bonded to one another, for example via a linker (flexible spacer). Linkers of this kind are known to a person skilled in the art and are selected in particular from the material group of the C1-C12 alkyl groups, C1-C12 alkenyl groups, C1-C12 alkoxy groups, C1-C12 polyalkoxy groups, aliphatic or cyclic diamines and cyclic or polycyclic aryl groups. The linkers are preferably bonded via a reactive coupling group (functional group) to the compound 1 or 2. The reactive coupling group is preferably an amino group (—NH2), thiol group (—SH), alcohol group (—OH), amide group (—C(=O)NH2)), trichlorosilyl group (—SiCl3) or carboxyl groups (—C(=O)OH)).

The substrate is preferably rigid, partially rigid, or flexible.

It is in particular expedient for the substrate to be transparent. Substrates of this kind are known to a person skilled in the art and for example are selected from transparent substrates, such as glass, plastic (polyethylene terephthalate (PET for short), etc.), a metal strip or a metal mixed oxide (for example indium tin oxide) or mixed layers thereof. The substrate can be flat or curved.

In accordance with a preferred embodiment of the present invention two optical spacer layers are arranged within the optical micro cavity.

The resonance wavelength of the optical micro cavity in the optoelectronic component according to the invention can particularly advantageously be set in the range of visible light, near ultraviolet (UV), or in the IR range by the thickness of the optical spacer layers.

The two optical spacer layers within the optical micro cavity are used a) to place the resonance wavelength of the optical micro cavity in the absorption range of the direct interchromophoric charge transfer state and b) to orientate the photoactive layer in the spatial intensity maximum of the resonance wavelength within the optical micro cavity.

The spatial intensity maximum is defined as the spectrally resolved maximum of the spatial intensity distribution of the optical field.

In order to selectively address a predefined resonance wavelength, the thicknesses of the optical spacer layers are selected so that the optical path length between the mirror surfaces corresponds in the range of 25% to 75% to the wavelength of the signal to be detected, very particularly preferably corresponds to half the wavelength of the signal to be detected, however plasmonic effects for example lead to deviations of the aforementioned provision in the region of ±50%.

Optical spacer layers which, in plane-parallel arrangement of the mirror surfaces, generate a geometric distance of the mirror surfaces between 100 nm and 5000 nm, preferably between 200 and 1000 nm, have proven to be expedient in the sense of the invention.

In a tilted arrangement of the two opposing mirror surfaces the optical spacers generate a variance of the geometric distance of both mirror surfaces in the range of 1 to 500 nm, preferably 10 to 100 nm. The average geometric distance of the two mirror surfaces produced by the optical spacer layers lies in the range of 100 to 5000 nm, particularly preferably 200 to 1000 nm. The variance of the distance of the mirror surfaces particularly advantageously allows a spectroscopic examination of the incident electromagnetic radiation, wherein the electrodes are formed in a number of pieces (i.e. as an array) and are each connected to a separate read-out unit.

Materials that are suitable as materials for the optical spacer layers are those that grow smooth (the layer preferably has global thickness variation of less than 5 nm, preferably less than 2 nm) and a refractive index that is at most as great as the maxima of the refractive indices of all other layers disposed between the mirror surfaces. The optical spacer layers, in respect of the wavelength to be detected, furthermore have an absorption of less than 0.1%, preferably less than 0.01%. Organic semiconductors, for example both small molecules which are applied by means of vacuum processing or liquid processing, for example aromatic amines (such as N,N,N',N'-tetrakis(4-methoxyphenyl)-benzidines (also MeO-TPD for short), 2,7-bis[N,N-bis (4-methoxy-phenyl)amino]9,9-spiro-bifluorenes (also Spiro-MeO-TPD for short) or N4,N4'-bis(9,9-dimethyl-9H-fluoren-2-yl)-N4,N4'-diphenylbiphenyl-4,4'-diamines (also BF-DPB for short) or 9,9-bis[4-(N,N-bis-biphenyl-4-yl-amino)phenyl]-9H-fluorenes (also BPAPF for short)), and also polymers that are applied by means of liquid processing, such as poly(3,4-ethylenedioxythiophene poly(styrene-sulfonate (PEDOT:PSS for short), or oxides such as silicon oxide (SiO2 for short) are suitable for this purpose.

In accordance with a preferred embodiment of the present invention the optical spacer layers are formed as electron-conducting or hole-conducting transport layers.

In accordance with a further preferred embodiment of the present invention the optical spacer layers are formed as optical filters for electromagnetic radiation from the visible wavelength range. Instead of in the photoactive layer, wavelengths from this range are absorbed in the optical spacer layer, where they do not contribute to the photocurrent of the optoelectronic component (as is often desired for infrared detectors). In this regard, the optical spacer layer for example consists of the compound 1 or compound 2 (with a layer proportion of at least 80 mass percent).

It can be expedient that electron-conducting or hole-conducting transport layers have an n- or p-doping in the range of from 1 to 50 mass percent (Ma.-% for short). The transport layers preferably have an n- or p-doping in the range of 1 to 25 Ma.-%, particularly preferably from 1 to 10 Ma.-%. Ma.-%, according to definition, relates to the total composition of the transport layer.

Here, "n-doping" and "p-doping" refers to the introduction of freely movable negative and positive charges respectively into the electron-conducting or hole-conducting transport layer, which results in an increase of the free electron density or hole density of the accordingly doped transport layer in the state of thermodynamic equilibrium.

One embodiment of the present invention is characterized in that a heterocyclic radical or diradical, their dimers, oligomers, polymers, metallocenes (for example cobaltocene), alkali metals such as caesium, paddlewheel complexes (for example of tungsten, molybdenum or of chromium), dispiro compounds and polycycles or leukobases of dyes are used as n-dopant precursor or n-doping agent. For example, tetracyanoquinodimethanes, Lewis acids, radialenes, dithiolate transition metal complexes or fluorine-substituted fullerenes are suitable as p-dopants. Dopant precursors or doping agents of this kind are best known to a person skilled in the art.

Materials with energy adjustment of the transport level between photoactive layer and the transport layer are suitable as matrix molecules. Compound 2 thus again lends itself as the matrix of the electron-conducting optical spacer layer, in other words fullerenes, or compound 1 also lends itself as the matrix of the hole-conducting transport layer. Furthermore, the class of aromatic amines (for example N,N,N',N'-tetrakis(4-methoxyphenyl)-benzidines (also MeO-TPD for short), 2,7-bis[N,N-bis(4-methoxy-phenyl)amino]9,9-spiro-bifluorenes (also Spiro-MeO-TPD for short) or N4,N4'-bis(9,9-dimethyl-9H-fluoren-2-yl)-N4,N4'-diphenylbiphenyl-4,4'-diamines (also BF-DPB for short) or 9,9-bis[4-(N,N-bis-biphenyl-4-yl-amino)phenyl]-9H-fluorenes (also BPAPF for short)) are suitable as the matrix of the hole-conducting transport layer.

Furthermore, the class of quinolines (such as tris(8-hydroxy-quinolinato)aluminium (also Alq3 for short)), the phenanthrolines (such as 4,7-diphenyl-1,10-phenanthrolines (also Bphen for short), the trinaphthylenes (such as 2,3,8,9,14,15-hexafluoro-5,6,11,12,17,18-hexaaza-trinaphthylene (also HATNA-F6 for short)) or naphthalene diimides (such as N,N-bis(fluoren-2-yl)-naphthalenetetracarboxylic diimides (also Bis-Hfl-NTCDI for short)) are suitable as the matrix of the electron-conducting transport layer.

The proportion of the electrical signal output by the optoelectronic component that can be attributed to the irradiation thereof with an electromagnetic signal is given as: Iphoto=IES−Idark, wherein the variable Iphoto corresponds to the photocurrent, IES corresponds to the electrical signal, (i.e. the current under illumination), and Idark corresponds to the current without illumination. All three variables are dependent on an external voltage applied optionally.

The electrical signal obtained from the conversion of the electromagnetic signal is preferably measured by means of electrodes and a read-out unit. The reading of the electrical signal advantageously allows a further processing with a downstream electronics unit known to a person skilled in the art.

As applicable, the reading of the current from the optoelectronic component is supported by the application of an external voltage, which typically lies in the range between 0 and −100 V. The external quantum efficiency of the optoelectronic component in the detection range is particularly advantageously increased by the application of the external voltage, and the response time (rise time of the photocurrent when the detection wavelength is reached in the detector) is shortened.

The optoelectronic component according to the invention is advantageously characterized compared to the component known from the prior art by the detection of wavelengths above 1000 nm, wherein the tunability of the resonance wavelength and the low peak width at half-height of the EQE (or the spectral response) enable the use of the optoelectronic component according to the invention as a spectrometer.

A suitable selection of the compounds 1 and 2 in the active layer particularly advantageously enables a broad absorption range of the direct interchromophoric charge transfer state, along with free selection of the wavelength of the signal to be detected within this range.

The present invention also relates to an optoelectronic component on a substrate, preferably for use in a method according to the invention, comprising at least
  i. two mirror surfaces which are spaced apart from and opposing one another and which form an optical micro cavity,
  ii. a photoactive layer arranged between the mirror surfaces and comprising at least one compound 1 and one compound 2,
  wherein the energy difference between the HOMO energy of the compound 1 and the LUMO energy of the compound 2 lies below 1.6 eV,
  wherein the optical path length between the mirror surfaces corresponds in the range of 25% to 75% to the wavelength of the signal to be detected, and
  wherein the energy equivalent of the wavelength range of the electromagnetic signal to be detected lies in range of
  the energy difference defined by the HOMO energy of the compound 1 and the LUMO energy of the compound 2, and
  the energy difference defined by the HOMO energy and the LUMO energy of the compound 1,
  wherein the photoactive layer is aligned, within the optical micro cavity in the spatial intensity maximum of the wavelength of the electromagnetic signal to be detected, between the mirror surfaces.

In the sense of the present invention the optoelectronic component is formed as an infrared detector, solar cell, or as a component thereof. In the sense of the invention a detector is optimized as a photosensitive, optoelectronic component to provide the greatest possible photocurrent by converting the electromagnetic ambient radiation to be detected under the constraint of a minimal dark current.

In the sense of the present invention a solar cell is a photosensitive, optoelectronic component which is self-sufficient in terms of energy and which is optimized for providing the greatest possible electrical power by converting sunlight. Here, the constructive interference condition is preferably used in order to orientate the photoactive layers with respect to the wavelength with maximum extinction in the range of singlet absorption.

Since, in the sense of the invention, there is no need for any compounds that are absorbing in the visible wavelength range, the optoelectronic component according to the invention is transparent or at least partially transparent preferably in the visible wavelength range, in particular when used as an infrared detector. In the sense of the invention, a material is partially transparent when at least 30% of the radiation is transmitted in the visible wavelength range.

In accordance with a preferred embodiment of the present invention the component according to the invention has a read-out unit for reading out the electrical signal.

The read-out unit is preferably also used for the further processing of the read out electrical signal.

In accordance with a preferred embodiment of the present invention the optoelectronic component has at least two electrodes spaced apart from one another, which are formed as an electrode pair (i.e. anode and cathode).

In accordance with a preferred embodiment of the present invention the material from which the electrode is made has a high conductivity. If a mirror layer based on metal at the same time acts as an electrode, it preferably has a reflectivity between 80% and 100%, preferably between 95% and 100%, particularly preferably between 99% and 100%, wherein the material for example is selected from silver, aluminium and gold.

Otherwise, the electrode should have a high transparency, i.e. extinction coefficient between 0 and 10-2, preferably between 0 and 10-3, and particularly preferably between 0 and 10-4. In this regard, doped metal oxides for example, such as indium tin oxide (ITO for short) or aluminium zinc oxide (AZO for short), highly conductive, smoothly growing small molecules (for example by doping such as C60 doped with tetrakis(1,3,4,6,7,8-hexahydro-2H-pyrimido[1,2-a]pyrimidinato)-ditungsten (II) (Wpd for short, 16 mass percent doping)) or highly conductive, smoothly growing polymers such as poly(3,4-ethylenedioxythiophene poly(styrenesulfonate) (PEDOT:PSS for short), or graphene are suitable.

It can be provided that at least one electrode is formed in a number of pieces (i.e. as an array). Due to the electrode segments arranged in an array-like manner, there are advantageously a plurality of measurement ranges present in the optoelectronic component which are each read out separately by a read-out unit. This enables on the one hand a spatial resolution (for example for use in a camera with IR detector) of an irradiating electromagnetic signal that is to be detected, wherein the two mirror surfaces are arranged plane-parallel in this embodiment. On the other hand, electrode segments arranged in an array-like manner enable a spectral resolution in the sense of a spectrometer by means of an arrangement of the mirror surfaces tilted relative to one another, so that a different resonance wavelength is associated with each electrode segment, whereby the electromagnetic signal to be detected advantageously differs per electrode segment.

The optoelectronic component optionally has optical filter layers for reducing an undesirable photocurrent, as results for example from excitonic absorption. Incident electromagnetic radiation in the visible wavelength range, particularly of double order or more of the resonance wavelength, can thus be advantageously suppressed in respect of a contribution to the photocurrent. The optical filter layers are preferably used inside or outside the optical micro cavity. Suitable optical filter layers include organic materials with extinction coefficient between 0.2 and 3.0 for a wavelength interval between 75 nm and 600 nm, such as the perylenes (for example P4-2,3,10,11-tetrapropyl-1,4,9,12-tetraphenyl-diindeno[1,2,3-cd:1',2',3'-lm]perylene (P4-Ph4-DIP)), the phthalocyanines (for example ZnPc) and/or the oligothiophenes (for example 2,2'-((3", 4"-dimethyl-[2,2': 5', 2": 5", 2": 5"', 2"-quinquethiophene]-5,5"-diyl)bis(methanylylidene))-dimalononitrile (DCV5T-Me(3,3) for short), in each case as a pure, unmixed layer.

It can also be provided that the optoelectronic component has charge carrier blocking layers which advantageously suppress the transport of a free charge carrier to the disadvantageous electrode. This is achieved advantageously by materials which have a large band gap. In accordance with a preferred embodiment of the invention the function of the charge carrier blocking layer is taken on by the matrix materials of the transport layers.

The optoelectronic component optionally has barrier layers or an encapsulation which suppresses the infiltration of harmful environmental influences (such as oxygen or water) in the sense of the performance of the optoelectronic component. In accordance with the invention the barrier layers are rigid (for example glass), partially rigid, or flexible (for example a thin-film encapsulation by means of atomic layer deposition (ALD for short), preferably of oxides (such as molybdenum oxide) or by means of metals (such as aluminium) or organic matter (such as tris(8-hydroxy-quinolinato)-aluminium (Alq3))) in coordination with the substrate.

The optoelectronic component furthermore optionally has intermediate layers for smooth growing (what are known as germ layers) of the subsequent layers by materials having a high surface energy, such as gold or titanium, or diffusion barriers, for example intermediate layers of less noble metals, such as aluminium or oxides, such as molybdenum oxide, for more noble metals arranged thereabove.

Besides the detection of an individual wavelength, with a plane-parallel arrangement of the two opposed mirror surfaces, spectroscopic applications in the presented wavelength range are also desirable. The object in accordance with a second aspect of the present invention thus lies in providing a spectrometer.

The spectral resolution of the electromagnetic signal to be detected is achieved in accordance with a preferred embodiment of the invention in that the geometric distance between the two opposed mirror surfaces of an optoelectronic component according to the invention in at least one lateral direction, i.e. in a direction parallel to the surface of the substrate, on which the optoelectronic component is arranged, varies. By varying the geometric distance between the two mirror surfaces, the optical path length between the mirror surfaces varies, and thus the resonance wavelength of the optical micro cavity changes.

Here, the geometric distance between the mirror surfaces on the one hand can vary continuously in that the two mirror surfaces are arranged in a tilted fashion relative to one another with a variation of the optical cavity layer thickness for resolution of the detection wavelength by way of lateral displacement in the sense of a spectrometer.

If the mirror surfaces are tilted relative to one another, there is thus, in accordance with the invention, a gradient of the resonance wavelength in the plane of the substrate, wherein all resonance wavelengths present in the optical micro cavity lie in the range of the absorption of the direct interchromophoric charge transfer state and the energy equivalents thereof lie below the singlet absorption of the compound 1 (electron donor).

If the mirror surfaces are tilted relative to one another, the electrode is formed in a number of pieces (i.e. as an array), wherein the same number of electrically decoupled read-out units for reading out the photocurrent are connected.

On the other hand, the geometric distance between the mirror surfaces can vary discontinuously, i.e. in a stepped manner in discrete gradations. A discontinuous variance of the geometric distance between the mirror surfaces is provided as a result of the fact that the optoelectronic component has segments electrically insulated from one another, within which the two opposed mirror surfaces are arranged in a plane-parallel manner. Adjacent segments have different geometric distances between the two opposed mirror surfaces. The geometric distance between the mirror surfaces thus varies in segments. The optoelectronic component thus has a lateral structuring, i.e. a structuring in at least one direction parallel to the surface of the substrate, on which the optoelectronic component is arranged. The structuring can also be provided in two lateral directions in the form of pixels. Here, an optical micro cavity with a specific resonance wavelength is formed in each pixel, so that a specific detection wavelength in the range of the absorption of the direct interchromophoric charge transfer state can be associated with each pixel.

The above-mentioned continuous or discontinuous variation of the optical cavity layer thickness is preferably provided via the layer thickness variation of the optical spacer layers.

There is also the possibility to adjust the layer thickness variation via the thickness of the photoactive layer and/or other layers, such as the electrode thickness or organic layers, additionally or instead.

Besides the possibilities already listed, the tilting of the optoelectronic component by an angle of inclination in the range of from 0 to 90 degrees with respect to the irradiated electromagnetic signal to be detected likewise enables a variation of the resonance wavelength on the whole.

In accordance with a preferred embodiment of the present invention the method according to the invention and the optoelectronic component according to the invention are used for time-resolved readout of the telecommunication via optical waveguides. The method according to the invention and the structure according to the invention of the optoelectronic component particularly advantageously enable the simultaneous readout of a plurality of wavelengths (multiplexing). Relevant wavelengths here are 850 nm, 1310 nm, and 1550 nm, for example.

In an alternative embodiment of the present invention the method according to the invention and the optoelectronic component according to the invention are used for time-resolved readout of short-range wireless communication, in particular of mobile devices, such as mobile telephones or stationary devices, such as receivers of a remote control or of a computer.

In accordance with a particularly preferred embodiment of the present invention the method according to the invention and the optoelectronic component according to the invention are used to detect motion (motion sensors for example in the sense of security technology or computer games), distance (distance sensors for example in the sense of virtual reality) or position (for example light barriers or triangulation by means of a plurality of receivers).

Furthermore, the method according to the invention and the optoelectronic component according to the invention are used for the spatial resolution of infrared radiation, for example in the sense of infrared photography, detection of near-infrared-sensitive security features, for example in the case of passports, or non-destructive analyses for example of art objects (such as historical paintings) in respect of underlying layers.

In an alternative embodiment of the present invention the method according to the invention is used for providing electrical power in a self-sufficient manner in terms of energy by converting the infrared component of the solar spectrum in the sense of a solar cell or as part thereof.

Furthermore, the optoelectronic component according to the invention is used to produce a spectrometer in the near infrared range with the above-mentioned properties. Applications of a spectrometer of this kind are, in particular:

i) the recording of the spectrum in the near infrared range;
ii) the determination of the sample composition of an analyte-containing sample on the basis of absorption bands which are characteristic for specific molecular bonds;
iii) multiplexing for simultaneous readout of various wavelengths within the scope of telecommunication assisted by optical waveguides;
iv) medical diagnostics, such as the measurement of blood sugar levels or of the oxygen content in the blood (pulsoxymetry, comparison of the transmission of two wavelengths) or for example in neurosciences as an imaging method for the non-destructive examination of the brain or of tissues, or for urological examinations of the bladder;
v) quality control of agricultural and/or perishable products, for example for determining the content of water, proteins, fat or plastics materials;
vi) quality control of chemical and pharmaceutical products and petrochemistry;
vii) infrared astronomy;
viii) as a brain-computer interface, for example for patients with locked-in syndrome.

PRACTICAL EXAMPLES

The above-mentioned embodiments according to the invention are suitable for achieving the object. Combinations of the disclosed embodiments are also suitable for achieving the object. Preferred developments of the invention will emerge from the combinations of the claims or individual features thereof.

BRIEF DESCRIPTION OF THE DRAWING FIGURES

The invention will be explained in greater detail hereinafter on the basis of some practical examples and the associated figures. The practical examples are intended to describe the invention, although the invention is not limited to the practical examples.

Here:

FIG. 1 shows an illustration of various absorption mechanisms within the scope of organic semiconductors and subsequent extraction of the charge carriers. The left-hand illustration (a) shows the conventional singlet absorption of the individual materials. The right-hand illustration (b) shows the absorption of the direct interchromophoric charge transfer state as used in accordance with the invention.

FIG. 2 shows a comparison of the absorption behaviour of a pure ZnPc layer (| | |) compared with a ZnPc-C60 mixed layer (o o o) as photoactive layer; dashed characteristic curve (| | |): Fourier-transform photocurrent spectroscopy on a pure, unmixed ZnPc layer in the sense of a high-resolution absorption measurement; characteristic curve with circles (o o o): External quantum efficiency measurement of a solar cell (i.e. reference cell optimized for a resonance wavelength in the visible wavelength range) with a ZnPc:C60 mixed layer (mixing ratio 1:1 volume fraction).

FIG. 5 shows an overview of near infrared detectors, based on the absorption of the direct interchromophoric charge transfer of ZnPc-C60 mixed layers. Within the scope of a layer thickness variation, the thicknesses of the optical spacer layers X1 and X2, the thicknesses of the transparent silver mirror layer Y, and the thicknesses of the optical filter layer Z are varied simultaneously.

DETAILED DESCRIPTION

Figure 1:
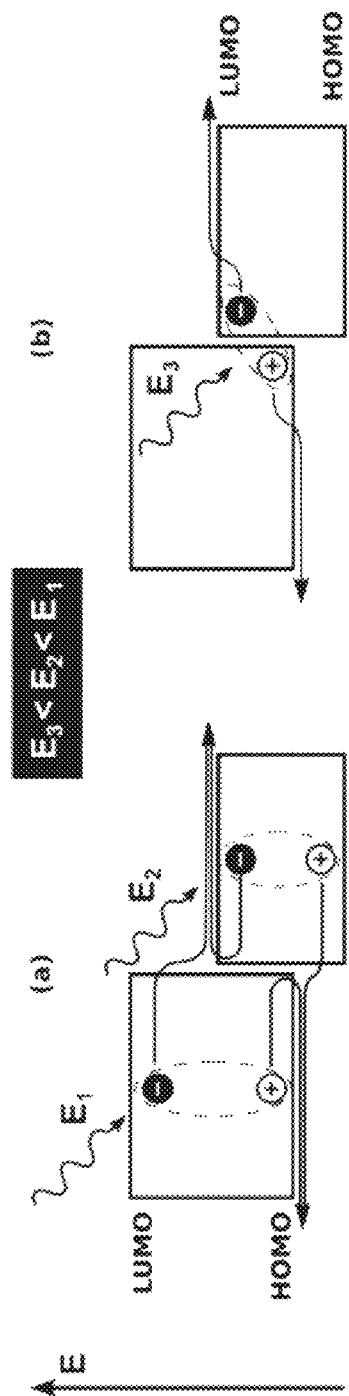

FIG. 1 shows an illustration of various absorption mechanisms within the scope of organic semiconductors and subsequent extraction of the charge carriers. The left-hand illustration (a) shows the conventional singlet absorption of the individual materials. These absorb photons of energy E1 and E2 or higher. For the separation and subsequent contribution of charge carriers to the photocurrent it is necessary that the Coulomb-bonded charge carrier pair (what is known as the exciton) initially diffuses to the interface of both compounds. The right-hand illustration FIG. 1(b) shows the absorption of the direct interchromophoric charge transfer state as used in accordance with the invention. At the interface of both organic semiconductors, an electron from the HOMO of compound 1 (material with higher HOMO energy) is lifted to the LUMO level of compound 2 (material with lower LUMO energy). In contrast to the left-hand illustration, the intermediate step of exciton diffusion to the common interface is spared. The direct interchromophoric charge transfer state absorbs photons of energy E3 (or higher), wherein, by a suitable selection of the materials, E3 can be selected to be smaller than E1 and E2, which is favourable for absorption in the infrared range.

Figure 2:
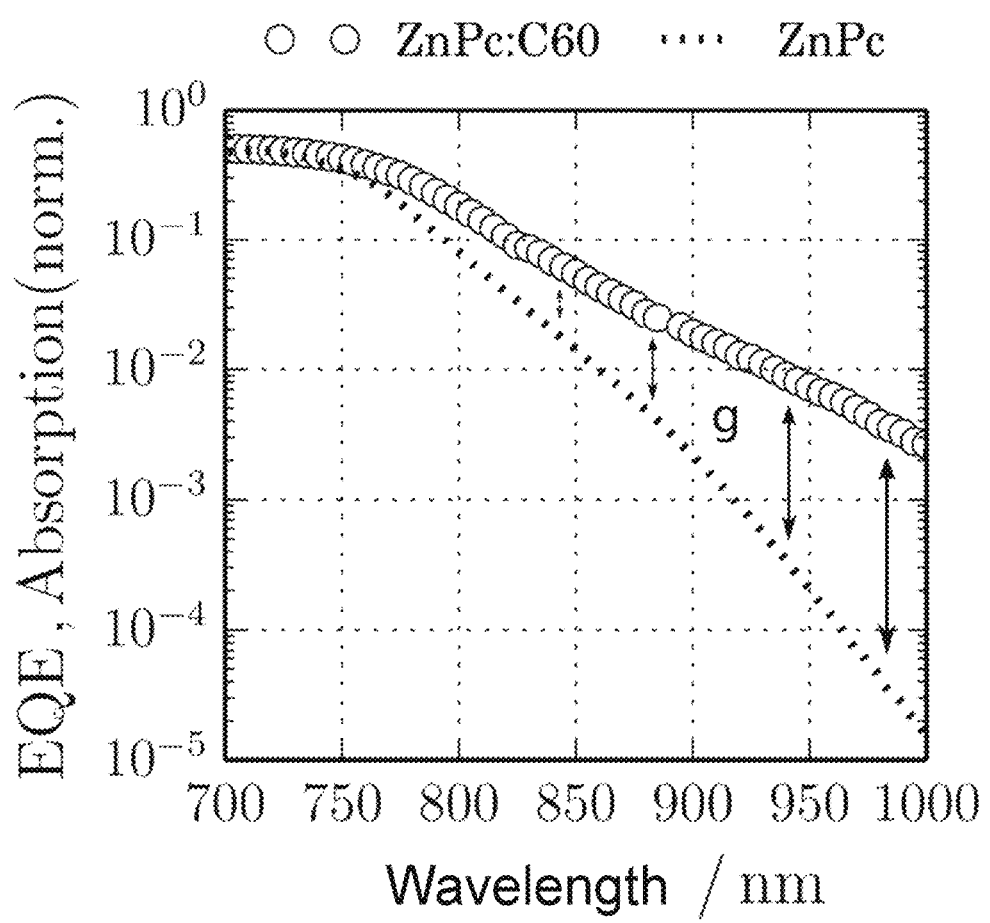

The ZnPc:C60 mixed layer used in FIG. 2 as the photoactive layer has a higher absorption for wavelengths greater than 750 nm than the pure ZnPc layer, wherein the absorption of the mixed layer exceeds that of the pure layer above 900 nm by one order of magnitude. The additional absorption (see region g in FIG. 2) originates from the direct absorption of the interchromophoric charge transfer state enabled by the interface between both dyes. On account of the higher optical band gap of C60, the absorption thereof above 700 nm can be ignored, and therefore the absorption of C60 can be omitted in this figure. Whereas the absorption signal at wavelengths below 850 nm can be attributed primarily to the absorption of the ZnPc singlet state, the direct charge transfer state of the ZnPc:C60 mixed layer is primarily absorbed thereabove.

Figure 3:
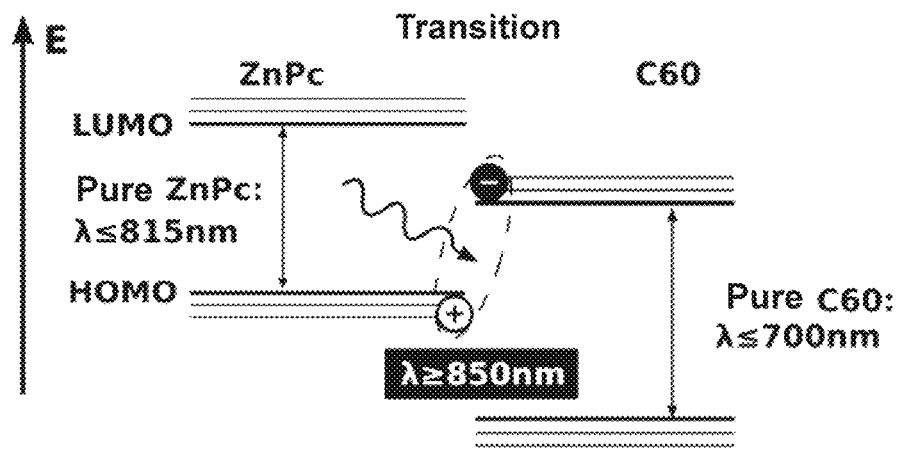
FIG. 3 shows a schema of the energy level of: on the left ZnPc, on the right C60, in the middle transition with direct interchromophoric charge transfer state.

As can be seen from FIG. 3, the pure C60 or ZnPc layer only absorbs photons of which the energy is greater than or equal to the optical band gap. For a pure C60 layer, these wavelengths are less than or equal to 700 nm, and for the pure ZnPc layer are less than or equal to 815 nm. At the transition of the two organic semiconductors, there exists also the direct interchromophoric charge transfer state in addition to the singlet state of the individual materials. This direct interchromophoric charge transfer state absorbs energies greater than the energy difference between the HOMO energy of ZnPc and the LUMO energy of C60 and thus enables the absorption of wavelengths greater than 850 nm.

Figure 4:
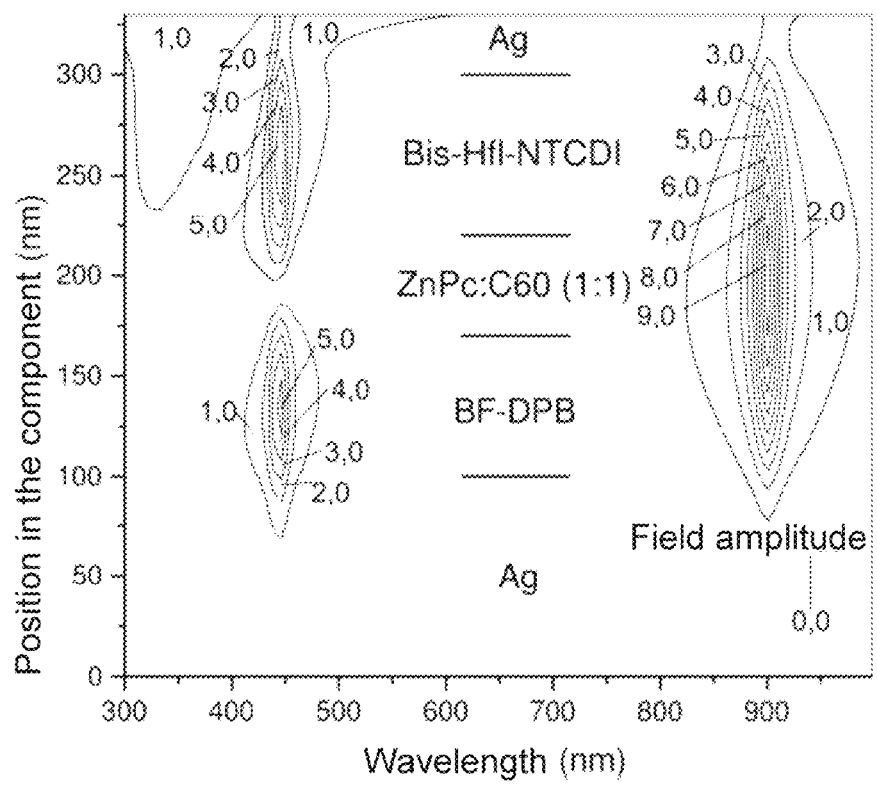
FIG. 4 shows the simulated amplitude distribution of the optical field of an optoelectronic component according to the invention plotted over position in the detector and irradiated wavelength of the incident electromagnetic radiation. The layer sequence inclusive of auxiliary lines is shown in the middle.

The basis of the calculation illustrated in FIG. 4 is the optoelectronic component: glass (1 mm, substrate)|gold (2 nm)|silver (28 nm, mirror layer, which functions at the same time as electrode)|N,N-bis(fluoren-2-yl)-naphthalenetetracarboxylic diimide (Bis-Hfl-NTCDI for short) doped with tetrakis(1,3,4,6,7,8-hexahydro-2H-pyrimido[1,2-a]pyrimidinato)ditungsten (II) (W2(hpp)4 for short) (79 nm, 7 Ma.-%, optical spacer layer, which at the same time acts as the electron-conducting transport layer)|zinc phthalocyanine (ZnPc for short):C60 (50 nm, 1:1, photoactive layer)|N,N'-((diphenyl-N,N'-bis)9,9,-dimethyl-fluoren-2-yl)-benzidine (BF-DPB for short) doped with Novaled Dopant P-Side No. 9 (NDP9 for short) (71 nm, 10 Ma.-%, optical spacer layer, which acts as the same time as hole-conducting transport layer)|aluminium (1 nm)|gold (2 nm)|silver (100 nm, mirror layer, which at the same time acts as electrode)|nitrogen (0.1 mm) encapsulated glass (1 mm), wherein the optical influence of the n-dopant within the scope of the simulation was ignored. Layers with a thickness less than 3 nm were considered in the optical simulation; nevertheless they have been omitted from the drawing. The interface between BF-DPB and silver (at component position 100 nm) and the interface between Bis-Hfl-NTCDI and silver (at component position 303 nm) characterize the two mirror surfaces in the optoelectronic component according to FIG. 4. The geometric thickness of 203 nm corresponds to approximately 350 nm optical layer thickness for a wavelength of 900 nm. Due to the partial infiltration of the optical field into the silver mirror layer, the field now expands to approximately 450 nm. The constructive interference condition for 900 nm (optical path length corresponds to half resonance wavelength) is thus satisfied. A stationary wave results, with maximum field intensity in the photoactive layer (i.e. in the ZnPc:C60 mixed layer). The specific component at the half resonance wavelength (approximately 455 nm) also has an intensity minimum of the optical field in the photoactive layer.

The layer thickness variation X1 and X2 (relating to layer numbers 3 and 7), as presented in FIG. 5, enables a variation of the detector wavelength or resonance wavelength in the sense of a spectrometer. By means of a simultaneous variation of the layer thicknesses of the optical spacer layers (X1, X2), the resonance wavelength of the optical micro cavity is advantageously tuned so that a) different resonance wavelengths are formed and b) at the same time the photoactive layer is in the intensity maximum of the optical field distribution (based on the resonance wavelength). On account of a slightly greater refractive index of the matrix of the hole transport layer (BF-DPB) in the near infrared compared to the matrix of the electron transport layer Bis-Hfl-NTCDI, the thicknesses of the hole transport layer are systematically selected to be greater, so as to position the photoactive layer in the maximum of the optical field based on the resonance wavelength. Based on the substrate-remote partially transparent silver mirror layer (layer number 10) of thickness 36 nm, the simulation according to the variation X1 and X2 accordingly results in the following resonance wavelengths: {605 nm, 880 nm, 920 nm, 950 nm, 980 nm, 1010 nm}. The first resonance wavelength 605 nm is used for comparison with regular solar cells and is not regarded as falling within the scope of the invention. The layer thickness variation Y is used to optimize the partially transparent silver mirror layer in respect of a high external quantum efficiency and the suppression of all wavelengths different from the resonance wavelength. The layer thickness variation Z is used to test optical filter layers which suppress the photocurrent contribution from the visible wavelength range.

Figure 6:
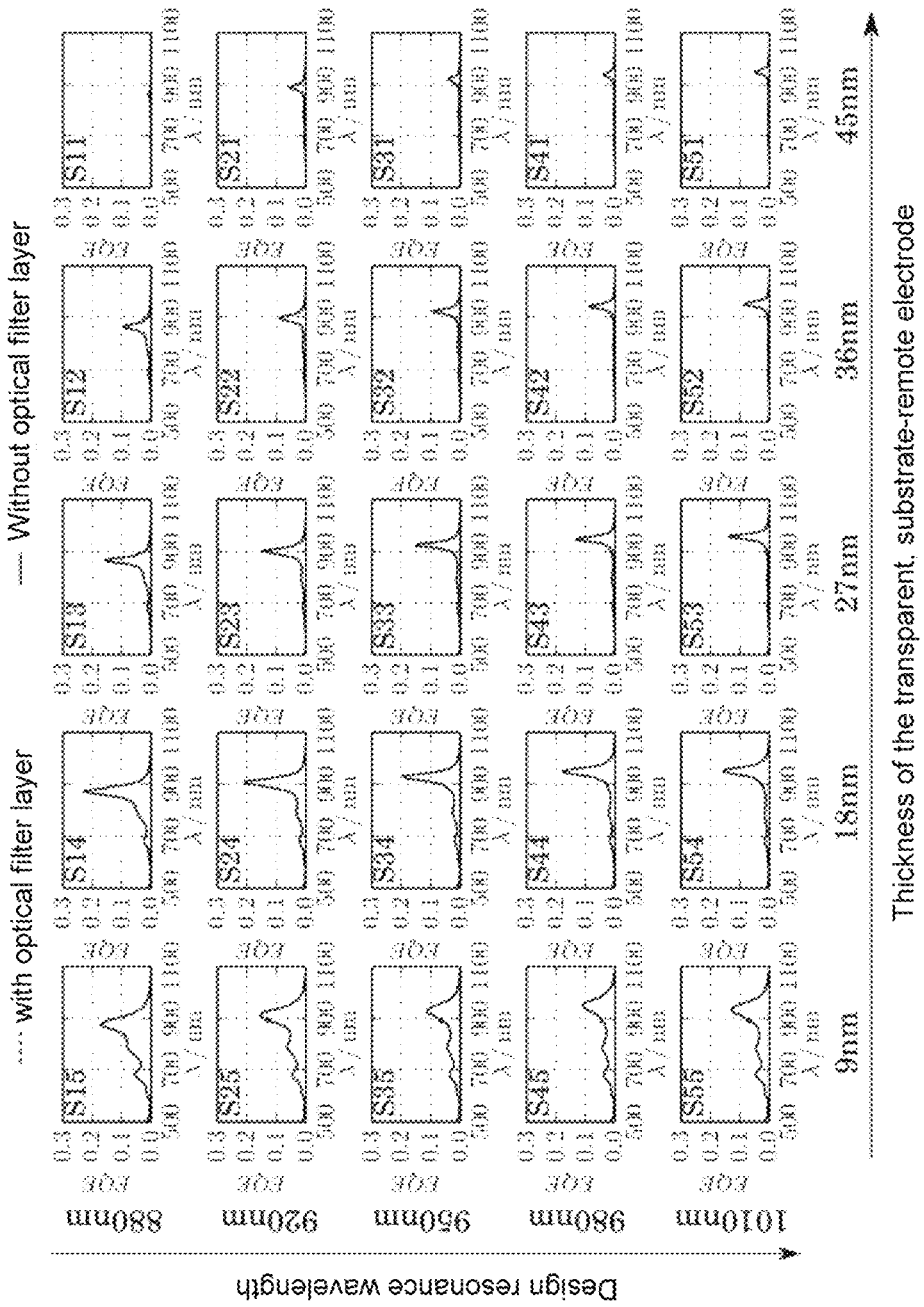
FIG. 6 shows the detection of electromagnetic radiation of various wavelengths with the aid of the sample set shown in FIG. 5, expressed in external quantum efficiency (EQE).
Figure 7:
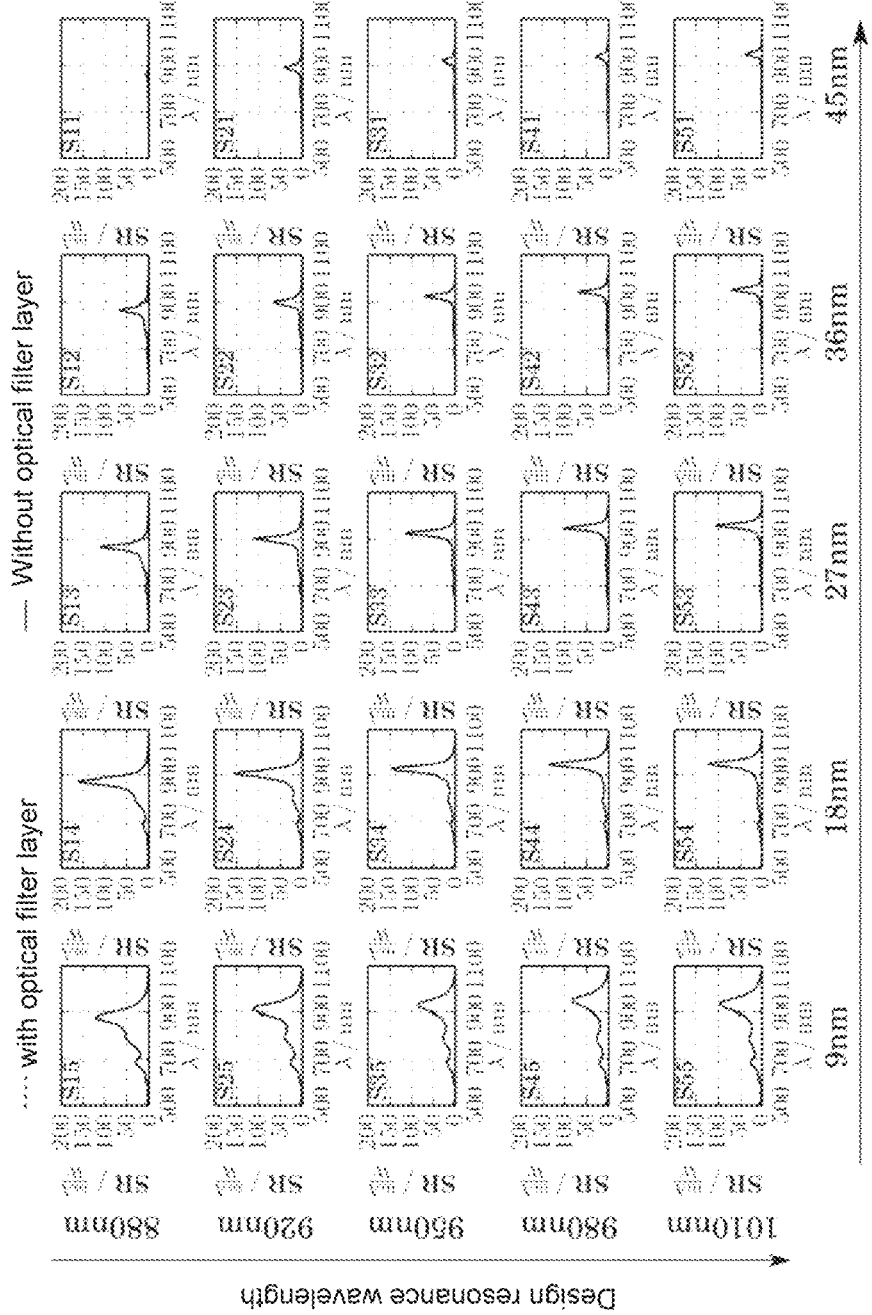
FIG. 7 shows the detection of electromagnetic radiation of various wavelengths with the aid of the sample set shown in FIG. 5, expressed in spectral response (SR).

As can be seen from FIG. 6 and FIG. 7, the experimentally measured resonance wavelength is a monotonously rising function of the simulated resonance wavelength, which demonstrates the tunability of the detector wavelength. A layer thickness of the transparent silver mirror layer between 27 nm and 36 nm generates, within the variation, the most powerful detectors in respect of the EQE. The optical filter layers have also proven to be advantageous in respect of detectors which are insensitive to wavelengths different from the resonance wavelength.

Figure 8:
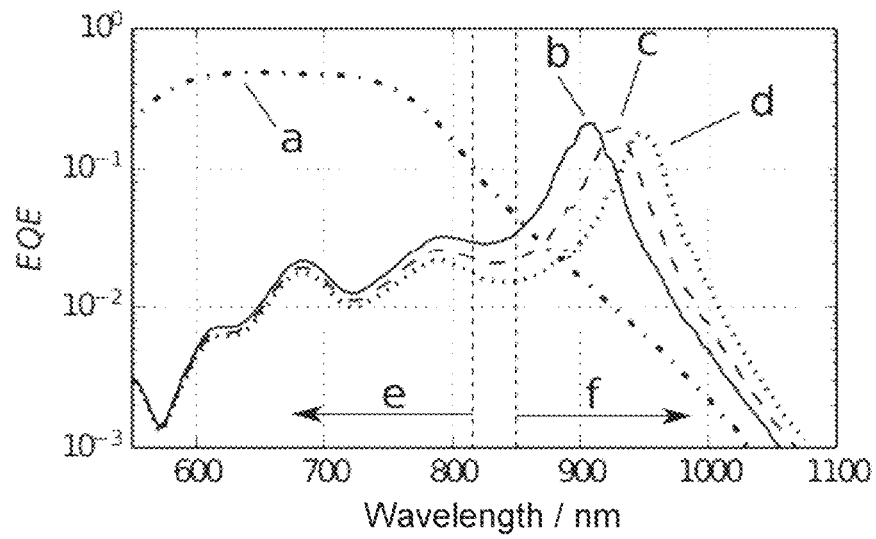
FIG. 8 shows the external quantum efficiency of various optoelectronic photosensitive components, for selected samples from the sample set shown in FIG. 5.

FIG. 8 shows selected EQE measurements from FIG. 6 with ZnPc:C60 as photoactive layer with variation of the resonance wavelength. FIG. 8(*a*) shows the EQE of a component optimized as solar cell (reference cell) with resonance wavelength in the visible wavelength range at 700 nm for efficient singlet absorption of ZnPc (compound 1). To this end, the following layer thicknesses were selected in respect of the optical spacer layers: X1=36 nm and X2=31 nm. Furthermore, a thin layer thickness is selected for the partially transparent silver mirror layer in order to come as close as possible optically to absorption without the presence of the mirror surfaces (i.e. free from interference): Y=9 nm. Furthermore, the optical filter layer is omitted: Z=0 nm. This sample is used to compare detectors with a regular solar cell and is not regarded as falling within the scope of the invention. FIG. 8(*b*)-(*d*) show the variation of the resonance wavelength in the range of absorption of the direct interchromophoric charge transfer states within the sense of a spectrometer. For (b), (c) and (d) Y=18 nm and Z=200 nm in each case, furthermore for (a) X1=71 nm, X2=70 nm with experimental resonance wavelength of 910 nm, for (b) X1=76 nm, X2=74 nm with experimental resonance wavelength of 930 nm, and for (c) X1=81 nm, X2=79 nm with experimental resonance wavelength of 950 nm.

Figure 9:
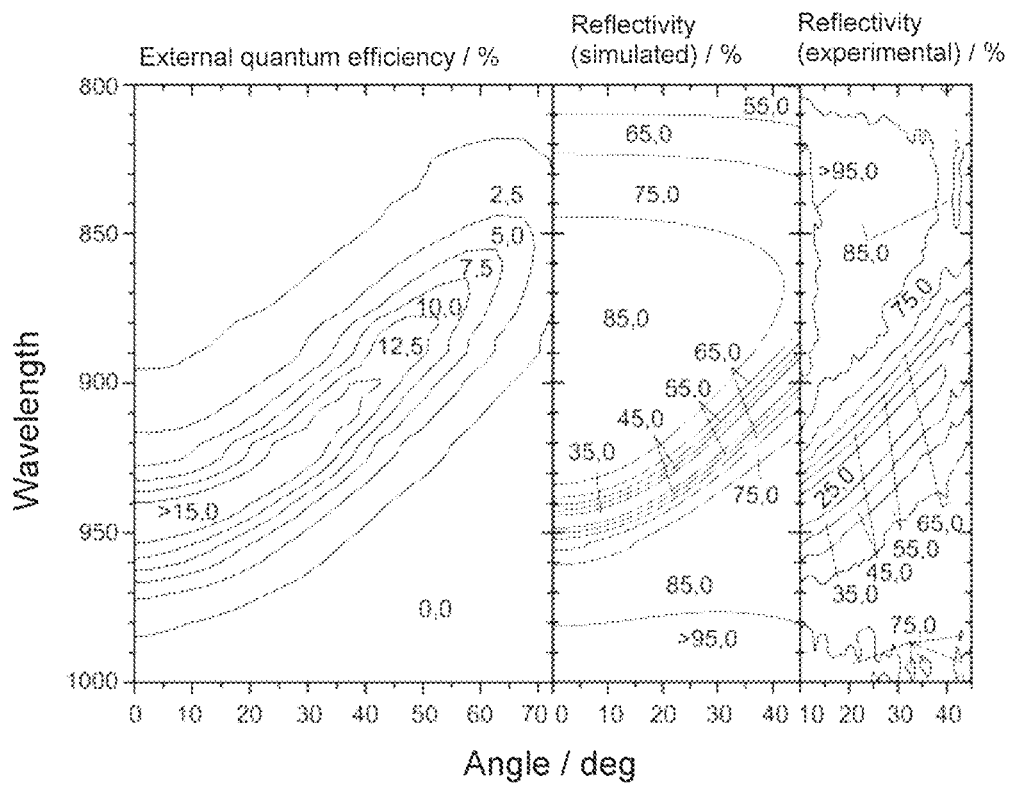
FIG. 9 shows the angle dependence of an optoelectronic component according to the invention in respect of optical and electrical parameters. From left to right: dependence of the experimentally measured external quantum efficiency; dependence of the simulated reflectivity; dependence of the experimentally measured reflectivity.

FIG. 9 is based on the following sample structure: glass (1 mm)|Ag (100 nm)|Bis-Hfl-NTCDI:W2 (hpp)4 (81 nm, 7 Ma.-%)|C60 (5 nm)|ZnPc:C60 (50 nm, 1:1 volume fraction) |ZnPc (5 nm)|BF-DPB:NDP9 (79 nm, 10 Ma.-%)|MoO3 (3 nm)|Au (1 nm)|Ag (18 nm)|Ag (75 nm)|MoO3 (10 nm)|Alq3 (50 nm)|ZnPc (200 nm)|P4-Ph4-DIP (200 nm)|nitrogen (0.1 mm)|glass (1 mm). The constructive interference condition of the optical micro cavity is expressed by a high absorption and low reflection of incident radiation of the resonance wavelength. In the simulated reflectivity, the resonance wavelength describes a parabola on account of the constructive interference condition. This behaviour is confirmed by the experimentally measured reflectivity and the electrical component behaviour, demonstrated on the basis of the external quantum efficiency. For wavelengths less than 850 nm, the reflection drops again: optical filter layers outside the optical micro cavity reduce the optical field in the visible range within the optical micro cavity. The detector is thus largely insensitive to visible light.

Figure 10:
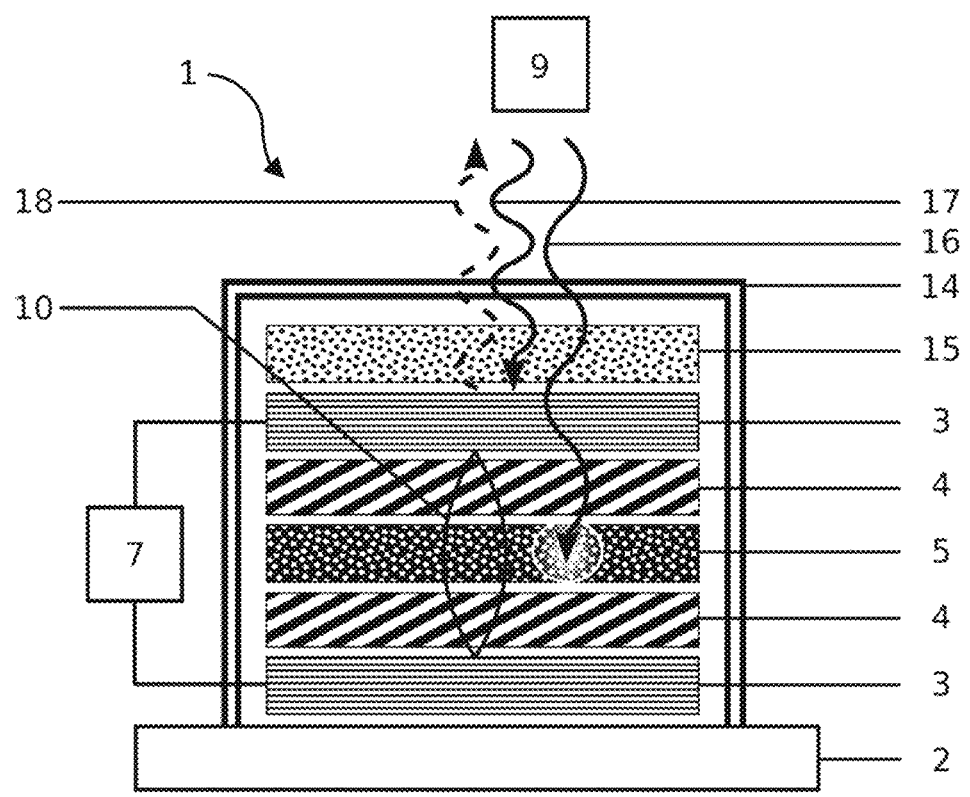
FIG. 10 shows the schematic layer sequence of an optoelectronic component according to the invention, wherein the mirror layers or the optical spacer layers are electrically conductive, so that they function at the same time as electrode or transport layers. The mirror surfaces are arranged plane-parallel.

FIG. 10 shows an optoelectronic component (1) according to the invention which has the following layer sequence: substrate (2) made of glass, mirror layer (3) made of silver (which at the same time acts as an electrode), an optical spacer layer (4) consisting of n-doped Bis-Hfl-NTCDI (which at the same time is used as a transport layer for electrons), a photoactive layer (5) consisting of a ZnPc:C60 mixed layer (with equal volume fractions), a further optical spacer layer (4) consisting of p-doped BF-DPB (which at the same time is used as a transport layer for holes), a further mirror layer (3) made of silver (which at the same time acts as an electrode), a barrier layer (15) consisting of the individual layers molybdenum trioxide (MoO3) and tris (8-hydroxy-quinolato) aluminium (Alq3), and an encapsulation (14) consisting of a cover glass applied by means of an adhesive. The two mirror layers (3) used as electrodes are electrically connected to one another by means of a read-out unit (7). If radiation (16) of the detection wavelength of the component (1) passes from the radiation source (9) to the substrate-remote mirror layer (3), a stationary wave (10) with spatial intensity maximum with respect to the detection wavelength in the photoactive layer (5) is formed within the optical micro cavity (that is to say between the mirror layers (3)). The layer thicknesses are adapted so that the wavelength, with constructive interference condition (i.e. the detection wavelength), lies in the range of absorption of the direct interchromophoric charge transfer state. If radiation (17) different from the detection wavelength of the component (1) passes from the radiation source (9) to the substrate-remote mirror layer, this radiation is reflected (18) at the substrate-remote mirror layer (3).

Figure 11:
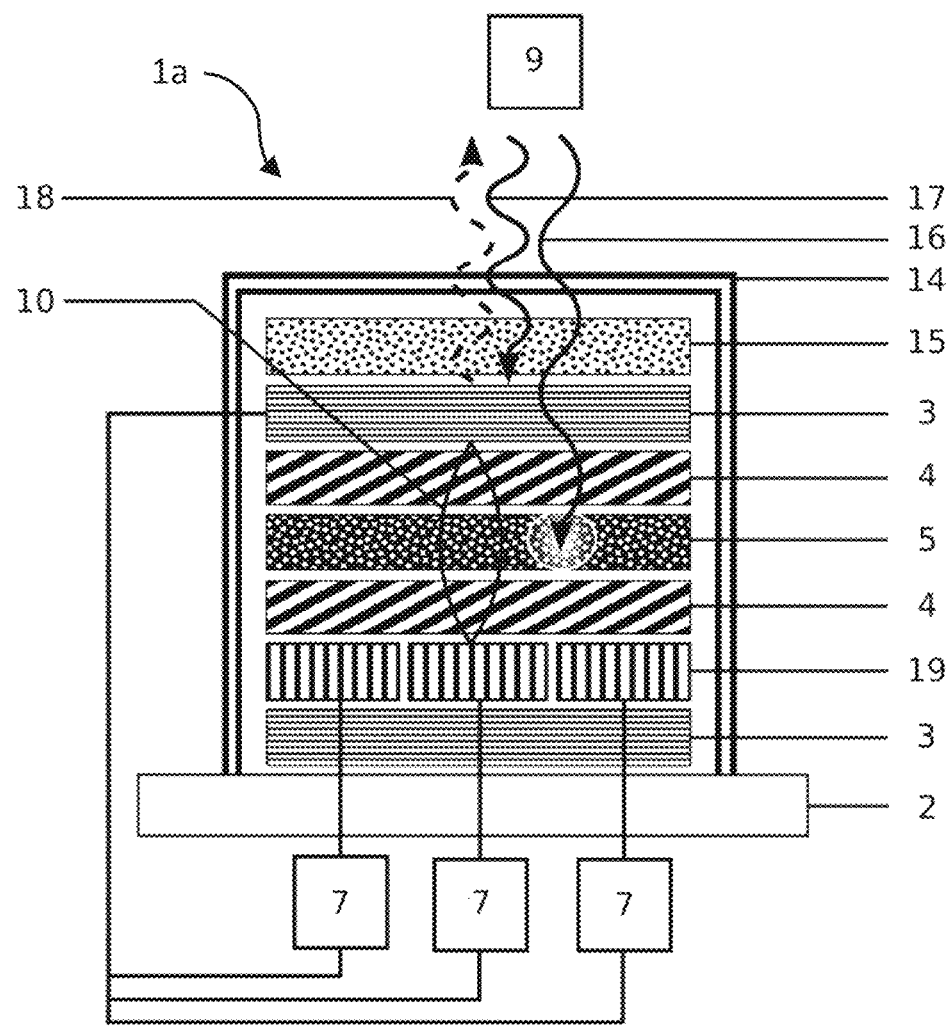
FIG. 11 shows the schematic layer structure of an optoelectronic component according to the invention as in FIG. 10, wherein here the electrode (19) is divided into segments and is provided with separate read-out units, so that the incident electromagnetic signal is spatially resolved. The mirror layer is not electrically conductive in this embodiment.

FIG. 11 shows an optoelectronic component (1*a*) according to the invention which has the following layer sequence: substrate (2) made of polyethylene terephthalate (PET), mirror layer (3) consisting of a multiple sequence of silicon dioxide (SiO2) and titanium dioxide (TiO2) (DBR mirror layer), a transparent, structured silver mirror layer in the sense of an electrode (19) structured in a segment-like manner, an optical spacer layer (4) consisting of n-doped C60 (which at the same time is used as a transport layer for electrons and absorbs wavelengths from the visible wavelength range passively (i.e. without subsequent contribution to the photocurrent)), a photoactive layer (5) consisting of an iron phthalocyanine (FePc):C60 mixed layer (with equal volume fractions), a further optical spacer layer (4) consisting of p-doped FePc (which at the same time is used as a transport layer for holes and passively absorbs wavelengths from the visible wavelength range), a further mirror layer (3) made of silver (which at the same time acts as an electrode), a barrier layer (15) consisting of MoO3, Alq3 and an aluminium oxide layer (Al2O3) provided by way of atomic layer deposition (ALD for short), and an encapsulation (14) consisting of a cover film made of PET applied by means of an adhesive. Each lower electrode segment (19) is connected to the substrate-remote electrode (mirror layer (3)) by means of a separate read-out unit (7). If radiation (16) of the detection wavelength of the component (1*a*) passes from the radiation source (9) to the substrate-remote mirror layer (3) accordingly, a stationary wave (10) with spatial intensity maximum with respect to the detection wavelength in the photoactive layer (5) is formed within the optical micro cavity (i.e. between the mirror layers (3)). The layer thicknesses are adapted so that the wavelength, by means of a constructive interference condition (i.e. the detection wavelength), lies in the range of absorption of the direct interchromophoric charge transfer state. If radiation (17) different from the detection wavelength of the component (1a) passes from the radiation source (9) to the substrate-remote mirror layer (3), this radiation is reflected (18) at the substrate-remote mirror layer (3). In contrast to the component according to the invention illustrated in FIG. 10, the detector (1a) can spatially resolve on account of the structuring of the near infrared signal. In addition, the response time of the component (1a) is accelerated on account of the smaller active area. This optoelectronic component (1a) according to the invention is also mechanically flexible.

Figure 12:
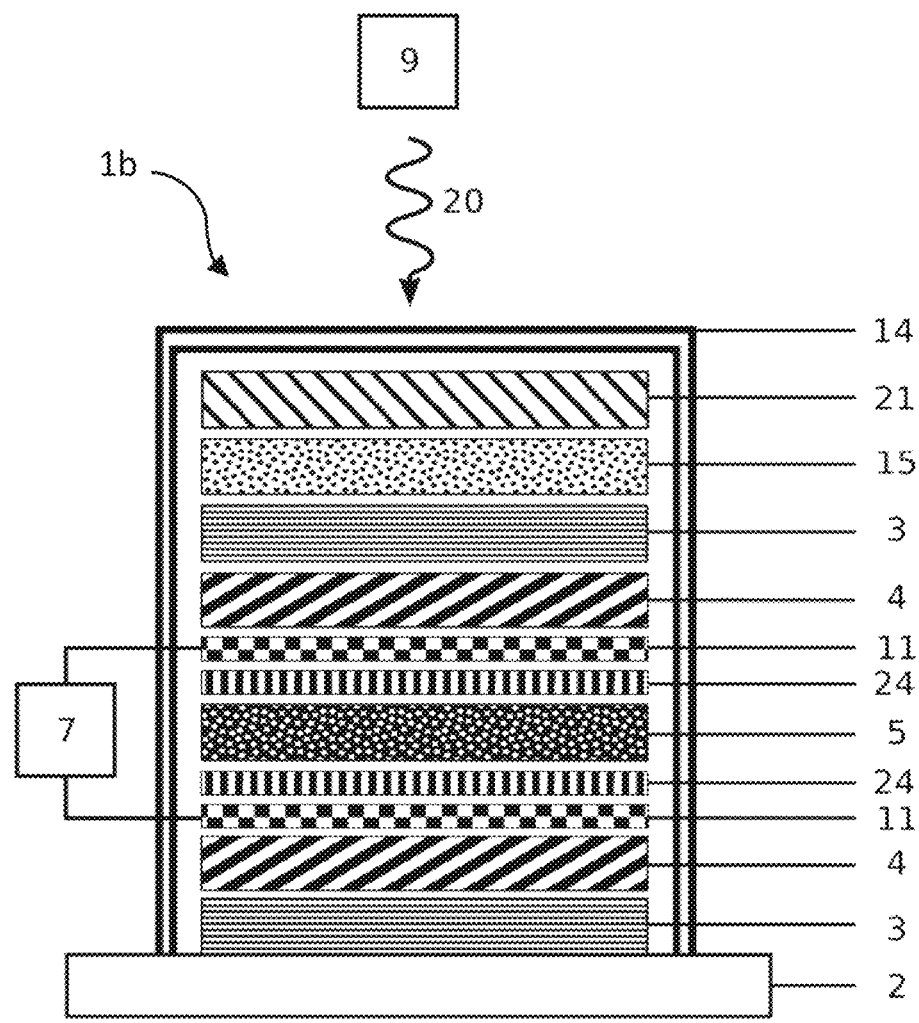
FIG. 12 shows the schematic layer structure of an optoelectronic component according to the invention, wherein, compared to FIG. 10, neither the mirror layers nor the optical spacer layers are electrically conductive. Instead, physically separated electrodes or transport layers are provided by the aforesaid layers.

FIG. 12 shows an optoelectronic component (1b) according to the invention which has the following layer sequence: substrate (2) made of glass, mirror layer (3) consisting of a multiple sequence of silicon dioxide (SiO2) and titanium dioxide (TiO2) (DBR mirror layer), an optical spacer layer (4) consisting of PEDOT:PSS, an electrode (11) highly transparent for the detection wavelength and consisting of indium tin oxide (ITO), a hole-conducting transport layer (24) consisting of p-doped tetraphenyldipyranylidene (TPDP for short), a photoactive layer (5) consisting of a TPDP:C60 mixed layer (with equal volume fractions), an electron-conducting transport layer (24) consisting of bathophenanthroline (Bphen for short), an electrode (11) highly transparent for the detection wavelength and consisting of indium tin oxide (ITO), a further optical spacer layer (4) consisting of undoped BF-DPB, a further mirror layer (3) consisting of a multiple sequence of silicon dioxide (SiO2) and titanium dioxide (TiO2) (DBR mirror layer), a barrier layer (15) consisting of MoO3 and Alq3, optical filter layers (21) for the visible wavelength range consisting of ZnPc and P4-2,3,10,11-tetrapropyl-1,4,9,12-tetraphenyl-diindeno[1,2,3-cd:1',2',3'-lm]perylene (P4-Ph4-DIP), and an encapsulation (14) consisting of a cover glass applied by means of an adhesive. The two electrodes (11) are electrically connected to one another by means of a read-out unit (7). The component (1b) according to the invention generates photocurrent, provided electromagnetic radiation (20) emitted from the radiation source (9) lies in the infrared range and corresponds to the detection wavelength of the component (1b).

The optical thicknesses of both optical spacer layers (4) are selected so that, in respect of a wavelength within the absorption range of the direct interchromophoric charge transfer state, a stationary wave with maximum intensity in the photoactive layer (5) is formed within the optical micro cavity. In this embodiment of the detector according to the invention the mirror layer is not formed as an electrode. Furthermore, in this implementation the optical spacer layers (4) do not take on an electrically conductive function. Due to the use of highly reflective DBR mirror surfaces both for the substrate-remote and substrate-near mirror surface, the absorption of the direct interchromophoric charge transfer state is particularly advantageously amplified.

Figure 13:
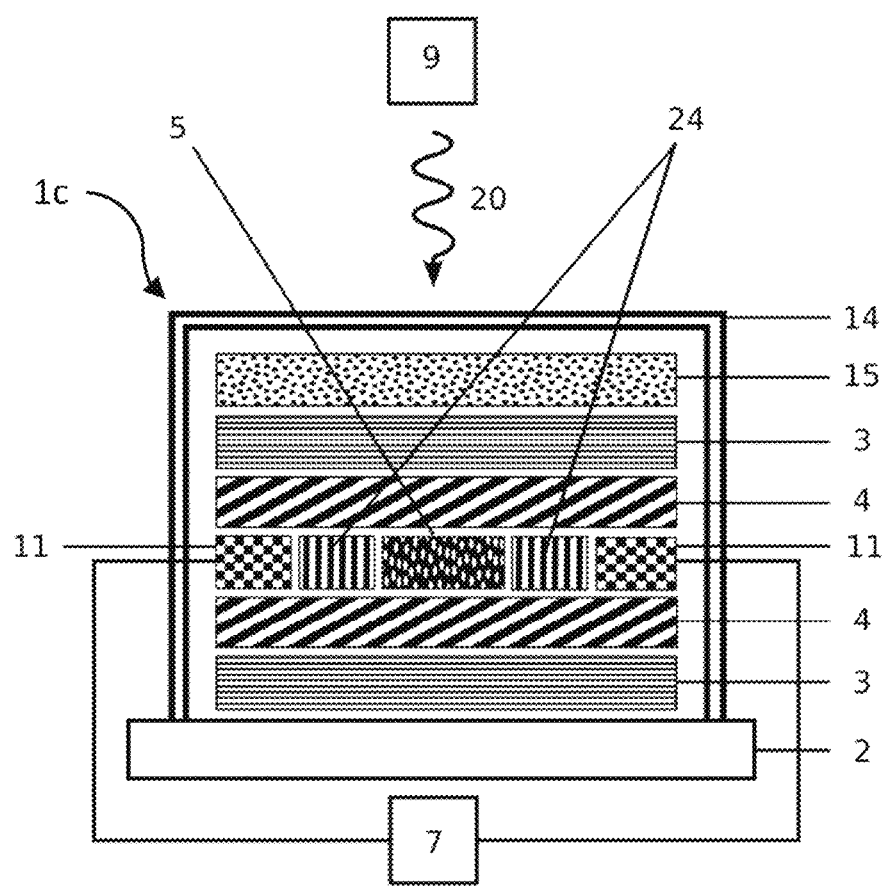
FIG. 13 shows the schematic layer structure of an optoelectronic component according to the invention, wherein, compared to FIG. 10, the current flow is parallel to the substrate and thus perpendicular to the incident light.

FIG. 13 shows an optoelectronic component (1c) according to the invention which has the following layer sequence: substrate (2) made of glass, a mirror layer (3) made of aluminium, an optical spacer layer (4) consisting of PEDOT: PSS, a layer sequence parallel to the substrate (2) with the following arrangement from left to right: a silver electrode (11), a hole-conducting transport layer (24) consisting of p-doped 9,9-bis[4-(N,N-bis-biphenyl-4-yl-amino)phenyl]-9H-fluorene (BPAPF for short), a photoactive layer (5) consisting of a 4,4',4"-tris(3-methylphenylphenylamino)-triphenylamine (m-MTDATA for short)-C60 mixed layer (with equal volume fractions), an electron-conducting transport layer (24) consisting of caesium-doped Bphen, and a silver electrode (11). Above the layer sequence parallel to the substrate, there follows a further optical spacer layer (4) consisting of C60, a further mirror layer (3) made of silver, a barrier layer (15) consisting of MoO3 and Alq3, and an encapsulation (14) consisting of a cover glass applied by means of an adhesive. The two electrodes (11) are electrically connected to one another by means of a read-out unit (7). The component (1c) according to the invention generates photocurrent provided electromagnetic radiation (20) emitted from the radiation source (9) lies in the near infrared range and corresponds to the detection wavelength of the component.

The optical thicknesses of both optical spacer layers (4) are selected so that, in respect of a wavelength within the absorption range of the direct interchromophoric charge transfer state, a stationary wave with maximum intensity in the photoactive layer (5) is formed within the optical micro cavity. In this embodiment of the detector (1c) according to the invention the mirror layer (3) is not simultaneously formed as an electrode. Furthermore, in this implementation the optical spacer layers (4) do not take on an electrically conductive function. In this implementation it has proven to be particularly advantageous that parasitic absorption (i.e. absorption of all layers disposed in the optical micro cavity and different from the photoactive layer) is low on account of the spatial shifting of the electrodes (11) outside the area used for absorption of the near infrared radiation, whereby the intensity of the optical field at the resonance wavelength rises.

Figure 14:
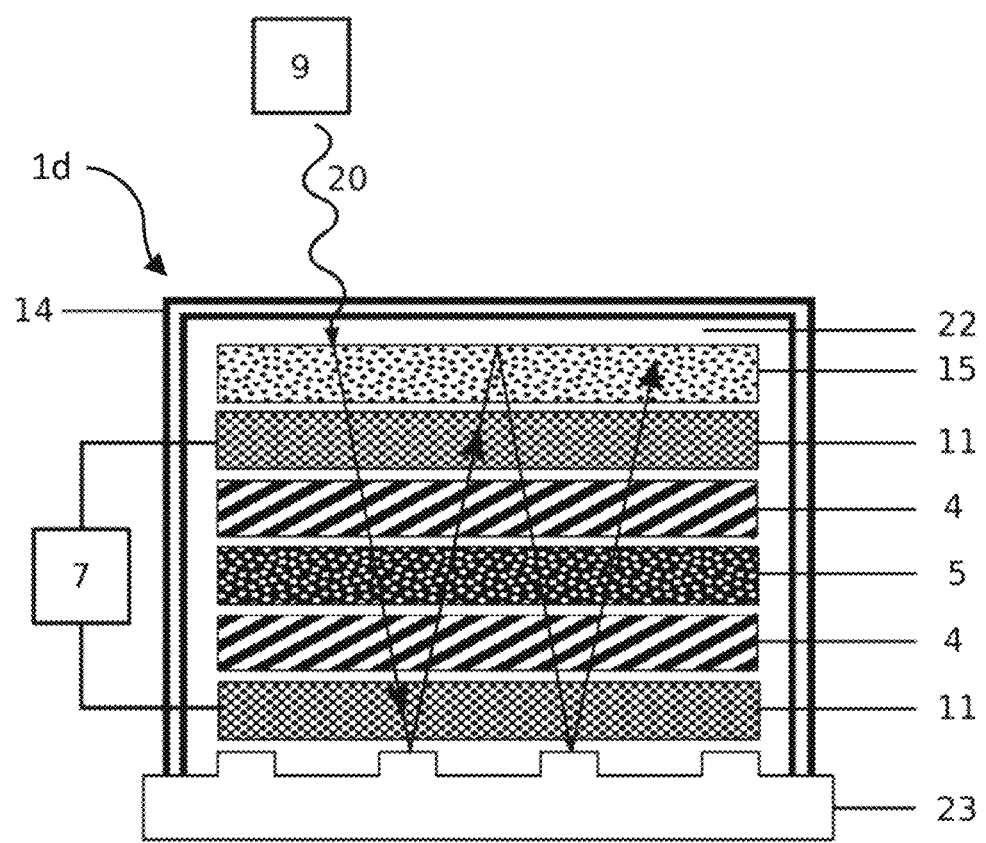
FIG. 14 shows the schematic layer structure of an optoelectronic component according to the invention, wherein, in contrast to FIG. 10, the substrate-near mirror layer is formed as a periodic interference grid in the sense of distributed feedback (DFB).

FIG. 14 shows an optoelectronic component (1d) according to the invention which has the following layer sequence: a laterally structured glass substrate (23) with a photoresist layer (for example maP1210), an electrode (11) that is highly transparent in respect of the detection wavelength and that is made of ITO, an optical spacer layer (4) consisting of n-doped Bis-Hfl-NTCDI (which at the same time is used as a transport layer for electrons), a photoactive layer (5) consisting of a lead phthalocyanine (PbPc for short):C60 mixed layer (with equal volume fractions), a further optical spacer layer (4) consisting of p-doped BF-DPB (which at the same time is used as a transport layer for holes), a further electrode (11) made of silver, a barrier layer (15) consisting of MoO3 and Alq3 and an inert gas (22), for example nitrogen, and an encapsulation (14) consisting of a cover glass applied by means of an adhesive. The mirror surfaces are in this implementation the laterally structured substrate (23) and the interface between the barrier layer (15) and the inert gas (22). The two electrodes (11) are electrically connected to one another by means of a read-out unit (7). The detection wavelength of the component (1d) can be adjusted by the optical distance between the two mirror surfaces and the period structure of the substrate (23), so that the wavelength, by means of a constructive interference condition, lies in the wavelength range of the absorption of the direct interchromophoric charge transfer state. Light wave conduction occurs parallel to the substrate (23) in this component (1d) with structured, substrate-near mirror surface (i.e. one-dimensional interference grid, DFB structure). The component (1d) according to the invention generates photocurrent provided electromagnetic radiation (20) emitted from the radiation source (9) lies in the near infrared range and corresponds to the detection wavelength of the component (1d).

Figure 15:
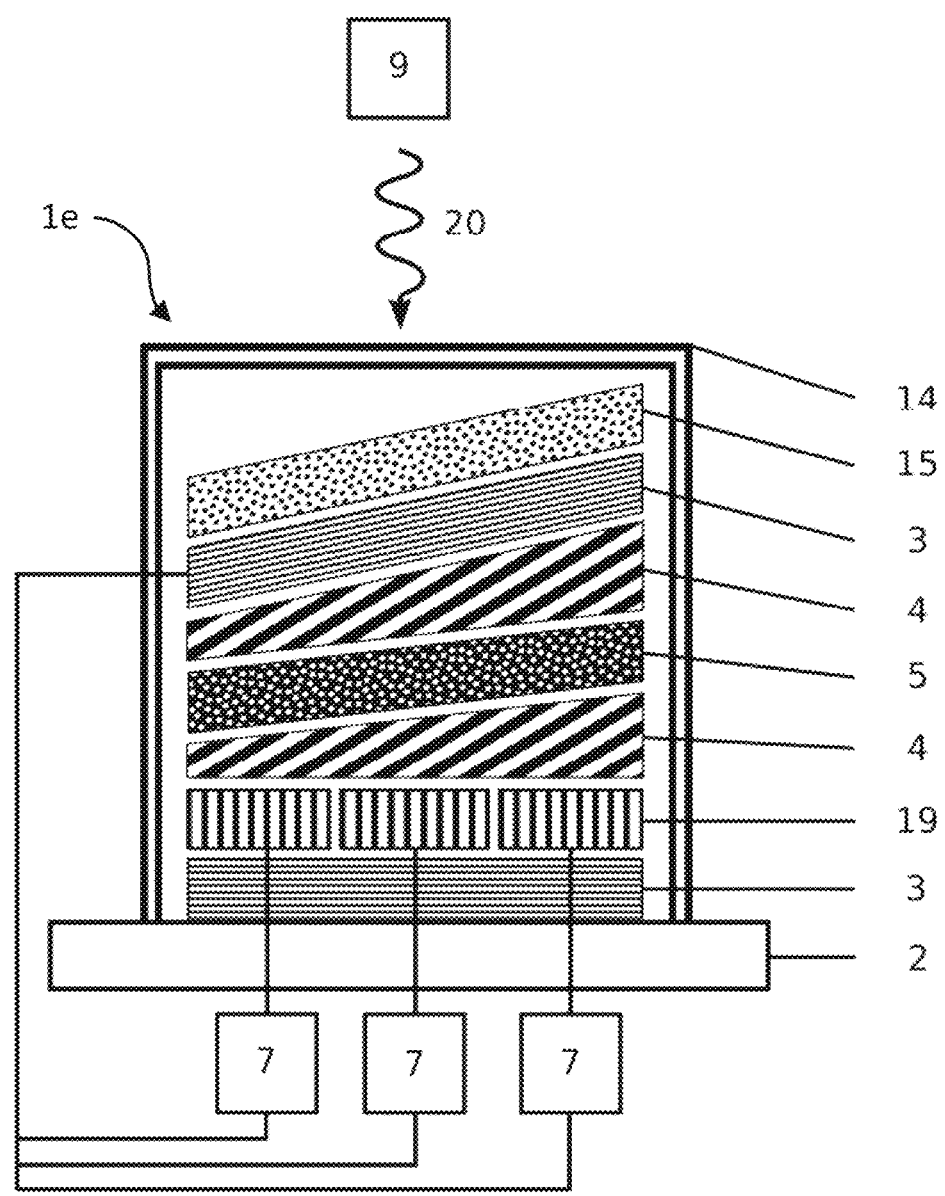
FIG. 15 shows the schematic layer structure of an optoelectronic component according to the invention, wherein, compared to FIG. 10, the mirror surfaces are tilted relative to one another and the substrate-near electrode is formed in segments, whereby this component enables spectroscopic examinations.

FIG. 15 shows an optoelectronic component (1e) according to the invention which consists of the same layers in the same order as FIG. 11. In contrast to FIG. 11 a layer thickness variation is present in the two optical spacer layers (4), parallel to the substrate. Different resonance wavelengths or detection wavelengths are thus formed for each area of the optical micro cavity delimited by an electrode segment (19). Whereas the optoelectronic component from FIG. 11 spatially resolves the incident electromagnetic signal, the component (1e) illustrated here spectrally resolves the incident electromagnetic signal. The component (1e) according to the invention generates photocurrent provided electromagnetic radiation (20) emitted by the radiation source (9) lies in the near infrared range and corresponds to the detection wavelengths of the component.

Figure 16:
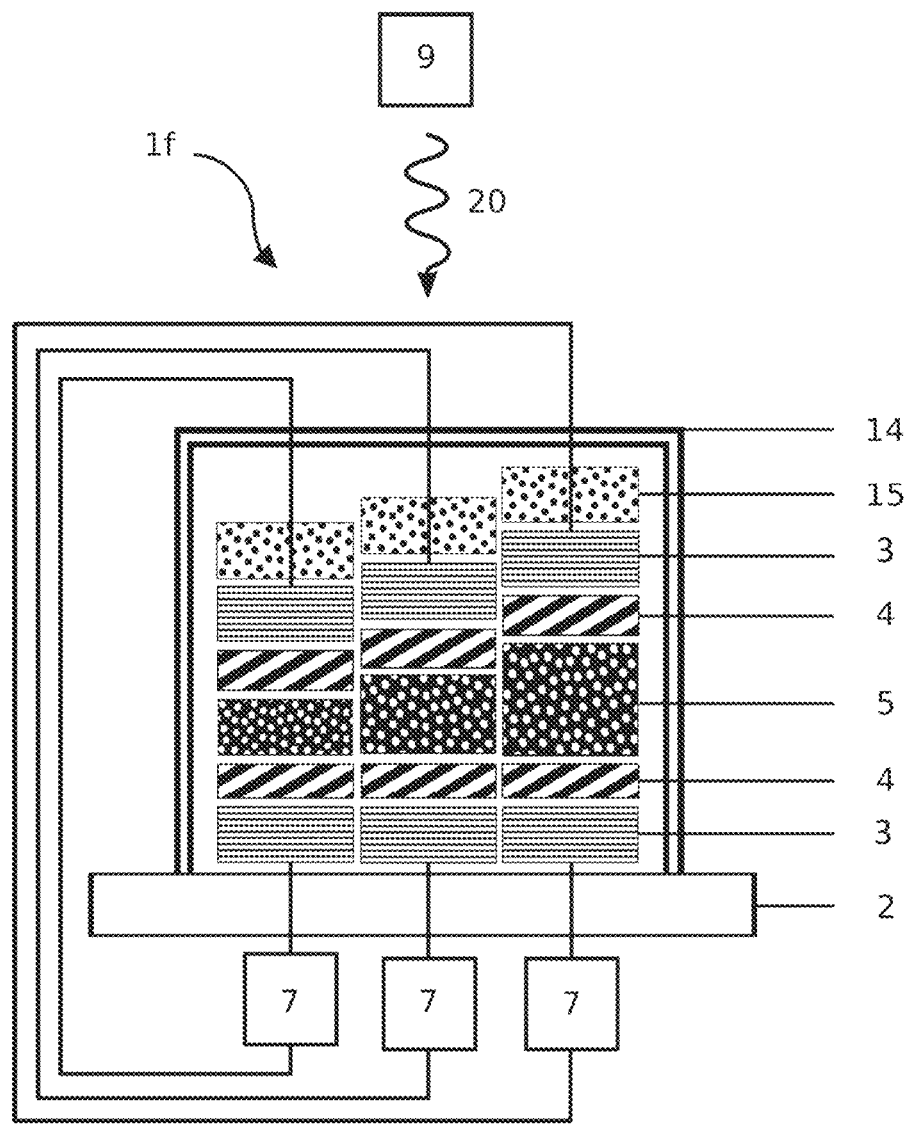
FIG. 16 shows the schematic layer structure of an optoelectronic component according to the invention, wherein, compared to FIG. 15, the distance variation of the mirror surfaces is stepped, and this component is again suitable for spectroscopic examinations.

FIG. 16 shows an optoelectronic component (1f) according to the invention which consists of the same layers in the same order as FIG. 10. In contrast to the exemplary embodiment shown in FIG. 10, the layers (3, 4, 5, 4, 3, 15) are structured laterally in the form of electrically insulated segments each connected individually to a read-out unit (7). The mirror layer (3) again acts as an electrode. As already in FIG. 15, here too there is a layer thickness variation of the mirror distance parallel to the substrate (2). In contrast to FIG. 15 however, it is not provided in a wedge-like manner, but in a stepped manner by means of discretely graduated layer thickness variations of the photoactive layer (5). A separate detection wavelength is thus associated with each electrically insulated segment. As also in FIG. 15, the described optoelectronic component (1f) spectrally resolves the incident electromagnetic signal.

LIST OF REFERENCE SIGNS 1, 1a, 1b, 1c, 1d, 1e, 1f Photosensitive, optoelectronic component
2 Substrate
3 Mirror layer
4 Optical spacer layer
5 Photoactive layer
7 Read-out unit
9 Radiation source
10 Stationary wave for resonance wavelength of the optical micro cavity
11 Electrode
14 Encapsulation
15 Barrier layer
16 Electromagnetic radiation emitted by the radiation source with the resonance wavelength
17 Electromagnetic radiation emitted by the radiation source different from the resonance wavelength
18 Wavelength different from the resonance wavelength reflected at the detector
19 Electrode structured in a segment-like manner
20 Electromagnetic radiation emitted by the radiation source
21 Optical filter layer for visible wavelength range
22 Inert gas
23 Laterally structured substrate
24 Transport layer

The invention claimed is:

1. A method for detecting an electromagnetic signal in the wavelength range of 780 nm to 10 μm, comprising the steps of:
a) providing an optoelectronic component arranged on a substrate, and having
i. two mirror surfaces which are spaced apart from and opposing one another and which form an optical micro cavity,
ii. a photoactive layer arranged between the mirror surfaces and comprising at least a first compound and a second compound, wherein an energy difference between HOMO energy and LUMO energy of the first compound is smaller than an energy difference between HOMO energy and LUMO energy of the second compound,
wherein an energy difference between HOMO energy of the first compound and LUMO energy of the second compound lies below 1.6 eV,
wherein an optical path length between the mirror surfaces corresponds in the range of 25% to 75% to a wavelength of the signal to be detected, wherein the optical path length is suited for generating a standing wave of the wavelength of the signal to be detected, and
wherein an energy equivalent of the wavelength range of the electromagnetic signal to be detected lies in the range between
the energy difference between the HOMO energy of the first compound and the LUMO energy of the second compound, and
the energy difference between the HOMO energy and LUMO energy of the first compound,
and corresponds to the absorption of a direct interchromophoric charge transfer from the first compound to the second compound, and
wherein the photoactive layer is aligned, within the optical micro cavity in a spatial intensity maximum of the wavelength of the electromagnetic signal to be detected, between the mirror surfaces, the optical micro cavity having a resonance wavelength in the range of the absorption of the direct interchromophoric charge transfer from the first compound to the second compound;
b) irradiating the optoelectronic component with an electromagnetic signal in the wavelength range of 780 nm to 10 μm;
c) amplifying the electromagnetic signal to be detected within the optical micro cavity by generating a standing wave, wherein, induced by the wavelength of the signal to be detected, a direct interchromophoric charge transfer from the first compound to the second compound takes place; and
d) converting the electromagnetic signal into an electrical signal.

2. The method according to claim 1, wherein the optoelectronic component further comprises a first optical spacer layer configured as a hole-conducting transport layer positioned between the photoactive layer and a first mirror surface of the two mirror surfaces, and a second optical spacer layer configured as an electron-conducting transport layer positioned between the photoactive layer and a second mirror surface of the two mirror surfaces.

3. The method according to claim 1, wherein the two opposing mirror surfaces are arranged plane-parallel to one another with a geometric distance between the two opposing mirror surfaces in the range of 100 nm and 5000 nm.

4. The method according to claim 1, wherein the electromagnetic signal is detected in a spectrally resolved manner, and wherein a geometric distance between the two opposing mirror surfaces of the optoelectronic component varies continuously or discontinuously in at least one lateral direction.

5. The method according to claim 4, wherein the two opposing mirror surfaces are arranged tilted with a continuous variance of the geometric distance in the range of 1 nm to 500 nm and an average geometric distance in the range of 100 nm and 5000 nm.

6. The method according to claim 4, wherein the two opposing mirror surfaces are arranged with a discontinuous variance of the geometric distance, wherein the optoelectronic component has segments which are electrically insulated from one another and within which the two opposing mirror surfaces are arranged in a plane-parallel manner, and wherein the geometric distance between the two opposing mirror surfaces differs from one another in adjacent segments.

7. The method according to claim 1, wherein the first compound and the second compound are present in the photoactive layer in a mixed manner.

8. The method according to claim 1, wherein the electrical signal is read out via electrodes and at least one read-out unit.

9. The method according to claim 1, wherein reading out the electrical signal is supported by applying an external voltage in the range between 0 and −100 V to electrodes of the optoelectronic component.

10. The method according to claim 1, the amplification of the signal to be detected within the optical micro cavity in step (c) is carried out by at least one of the following effects: plasmonic, dielectric or total reflection.

11. The method according to claim 1, wherein intensity of the electromagnetic signal to be detected is averaged over the photoactive layer, and is amplified by a factor 10 to 10000 in step (c).

12. An optoelectronic component on a substrate for detecting an electromagnetic signal in a wavelength range of 780 nm to 10 μm, comprising at least:
  i. two mirror surfaces which are spaced apart from and opposing one another and which form an optical micro cavity,
  ii. a photoactive layer arranged between the mirror surfaces and comprising at least a first compound and a second compound, wherein an energy difference between HOMO energy and LUMO energy of the first compound k smaller than an energy difference between HOMO energy and LUMO energy of the second compound, wherein an energy difference between HOMO energy of the first compound and LUMO energy of the second compound lies below 1.6 eV, wherein an optical path length between the mirror surfaces corresponds in the range of 25% to 75% to a wavelength of the signal to be detected, wherein the optical path length is suited for generating a standing wave of the wavelength of the signal to be detected, and wherein an energy equivalent of the wavelength range of the electromagnetic signal to be detected lies in, the range between an energy difference between the HOMO energy of the first compound and the LUMO energy of the second compound, and
  the energy difference between the HOMO energy and LUMO energy of the first compound,
  corresponding to the absorption of a direct interchromophoric charge transfer from the first compound to the second compound, wherein the photoactive layer is aligned, within the optical micro cavity in a spatial intensity maximum of the wavelength of the electromagnetic signal to be detected, between the mirror surfaces, and the optical micro cavity having a resonance wavelength in the range of the absorption of the direct interchromophoric charge transfer from the first compound to the second compound.

13. The optoelectronic component according to claim 12, wherein the optoelectronic component has hole-conducting or electron-conducting transport layers.

14. The optoelectronic component according to claim 12, wherein the optoelectronic component has optical filter layers and/or charge carrier blocking layers and/or germ layers and/or barrier layers and/or an encapsulation.

15. The optoelectronic component according to claim 12, wherein the optoelectronic component has a lateral structuring in segments that are electrically insulated from one another, and wherein at least a geometric distance between the two opposing mirror surfaces varies segmentally.

16. The method according to claim 1, employed for detecting electromagnetic radiation in the wavelength range of 780 nm to 10 um with spatial, temporal and/or spectral resolution as well as for further processing thereof.

17. The optoelectronic component according to claim 12, configured as a solar cell or as a component of a solar cell.

18. The method according to claim 1, further comprising an optical spacer layer positioned between the photoactive layer and each of the two mirror surfaces, the optical spacer layers comprising differing thicknesses and refractive indexes as compared to each other.

19. The method according to claim 18, wherein a first optical spacer layer comprises a hole-conducting transport layer, and a second optical spacer layer comprises an electron-conducting layer.

20. The method according to claim 1, wherein the photoactive layer is fully positioned between the mirror surfaces and spaced from the substrate.

21. The method according to claim 1, wherein the optoelectronic component is configured such that a global maximum of an external quantum efficiency (EQE) of the optoelectronic component with respect to a first wavelength of the signal to be detected lies in the range of the absorption of the direct interchromophoric charge transfer, and is greater by at least a factor of two as compared to the range of absorption of a singlet absorption charge transfer between the first compound and the second compound.

* * * * *

UNITED STATES PATENT AND TRADEMARK OFFICE
CERTIFICATE OF CORRECTION

PATENT NO. : 11,227,959 B2
APPLICATION NO. : 15/740409
DATED : January 18, 2022
INVENTOR(S) : Siegmund et al.

Page 1 of 1

It is certified that error appears in the above-identified patent and that said Letters Patent is hereby corrected as shown below:

In the Claims

Column 27, Line 46: Claim 12, Delete "compound k smaller" and insert -- compound is smaller --

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*